(12) United States Patent
Miki

(10) Patent No.: US 9,110,140 B2
(45) Date of Patent: Aug. 18, 2015

(54) SCAN CIRCUIT, SEMICONDUCTOR DEVICE, AND METHOD FOR TESTING SEMICONDUCTOR DEVICE

(71) Applicant: FUJITSU SEMICONDUCTOR LIMITED, Yokohama, Kanagawa (JP)

(72) Inventor: Kouji Miki, Fussa (JP)

(73) Assignee: SOCIONEXT INC., Yokohama (JP)

( * ) Notice: Subject to any disclaimer, the term of this patent is extended or adjusted under 35 U.S.C. 154(b) by 100 days.

(21) Appl. No.: 14/072,448

(22) Filed: Nov. 5, 2013

(65) Prior Publication Data

US 2014/0201582 A1    Jul. 17, 2014

(30) Foreign Application Priority Data

Jan. 17, 2013  (JP) .................................. 2013-006208

(51) Int. Cl.
*G01R 31/28*  (2006.01)
*G01R 31/3185*  (2006.01)

(52) U.S. Cl.
CPC *G01R 31/318536* (2013.01); *G01R 31/318544* (2013.01)

(58) Field of Classification Search
CPC ............... G01R 31/318566; G01R 31/318525; G01R 31/318541

USPC .......................................... 714/726, 727, 729
See application file for complete search history.

(56) References Cited

U.S. PATENT DOCUMENTS

| | | | |
|---|---|---|---|
| 6,242,269 B1* | 6/2001 | Whetsel | 438/11 |
| 2004/0078741 A1* | 4/2004 | Morton | 714/726 |
| 2009/0217116 A1* | 8/2009 | Motika et al. | 714/729 |
| 2010/0332930 A1 | 12/2010 | Yamanaka et al. | |
| 2012/0249204 A1* | 10/2012 | Nishioka et al. | 327/202 |
| 2013/0031433 A1* | 1/2013 | Kukreja et al. | 714/726 |
| 2013/0111285 A1* | 5/2013 | Chakravarty et al. | 714/726 |

FOREIGN PATENT DOCUMENTS

| | | |
|---|---|---|
| JP | 06-230075 A | 8/1994 |
| JP | 08-036509 A | 2/1996 |
| JP | 09-311157 A | 12/1997 |
| JP | 2008-145204 A | 6/2008 |
| JP | 2011-007761 A | 1/2011 |

* cited by examiner

*Primary Examiner* — David Ton
(74) *Attorney, Agent, or Firm* — Arent Fox LLP

(57) ABSTRACT

A semiconductor device includes: a combination circuit; and a scan circuit, wherein the scan circuit includes: a first scan chain in which a plurality of first flip-flops are connected in series; and a second scan chain in which a plurality of second flip-flops are connected in series. The first scan chain is configured to capture first output data of at least one of the first flip-flops of the second scan chain, and the second scan chain is configured to capture second output data of at least one of the second flip-flops of the first scan chain.

14 Claims, 29 Drawing Sheets

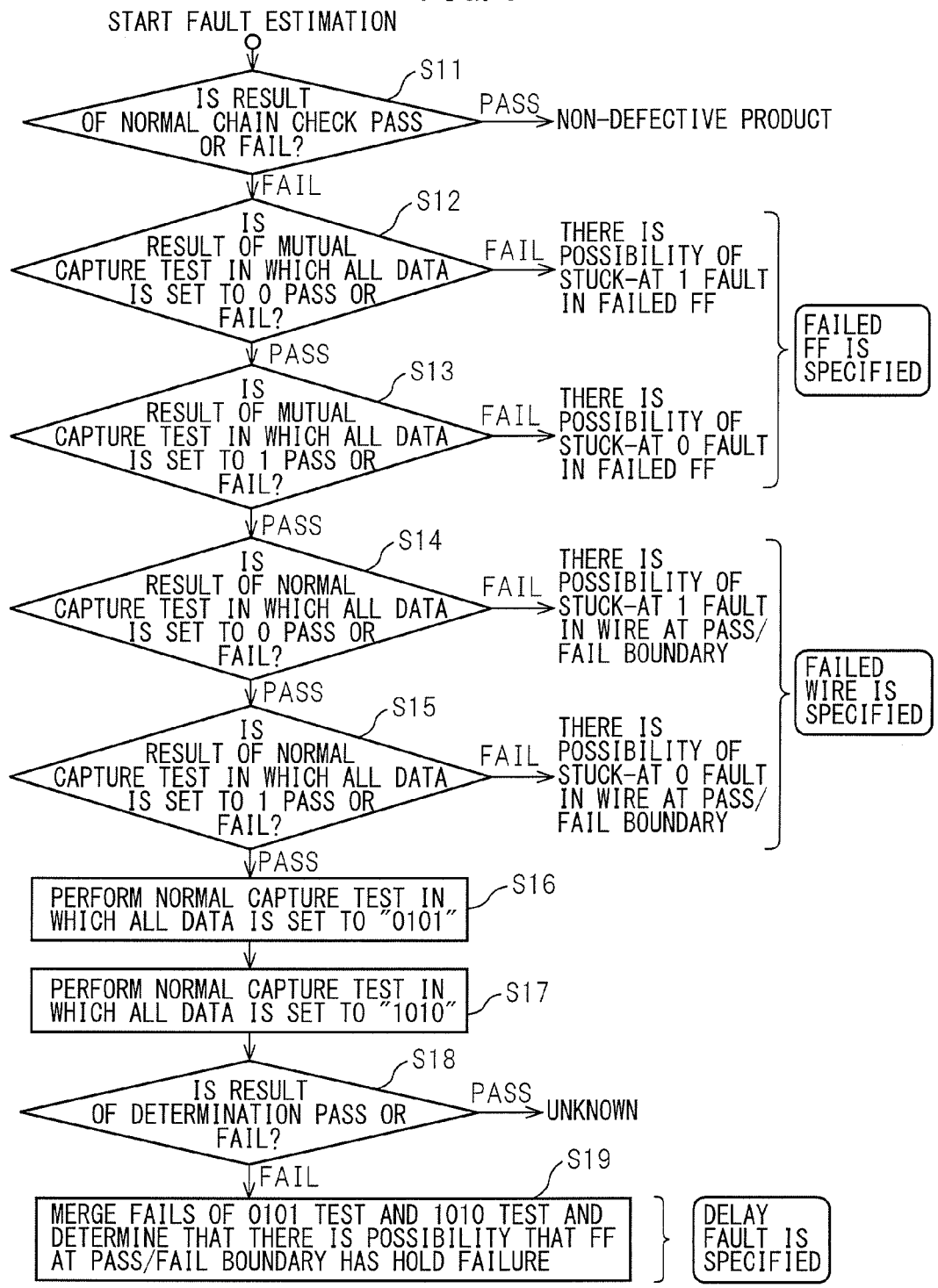

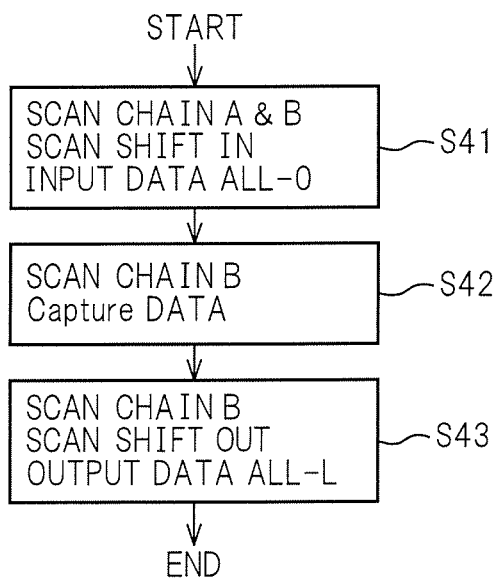
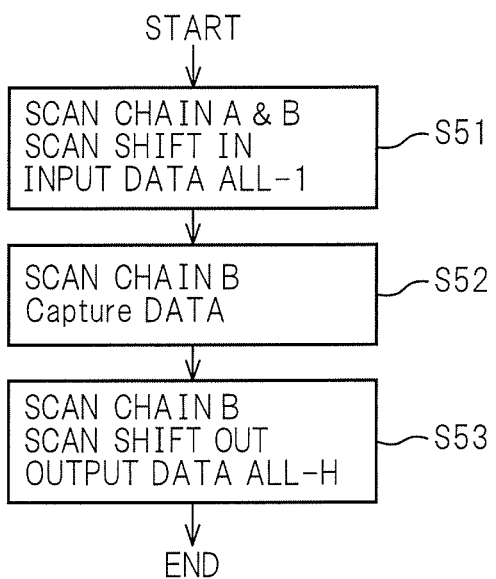

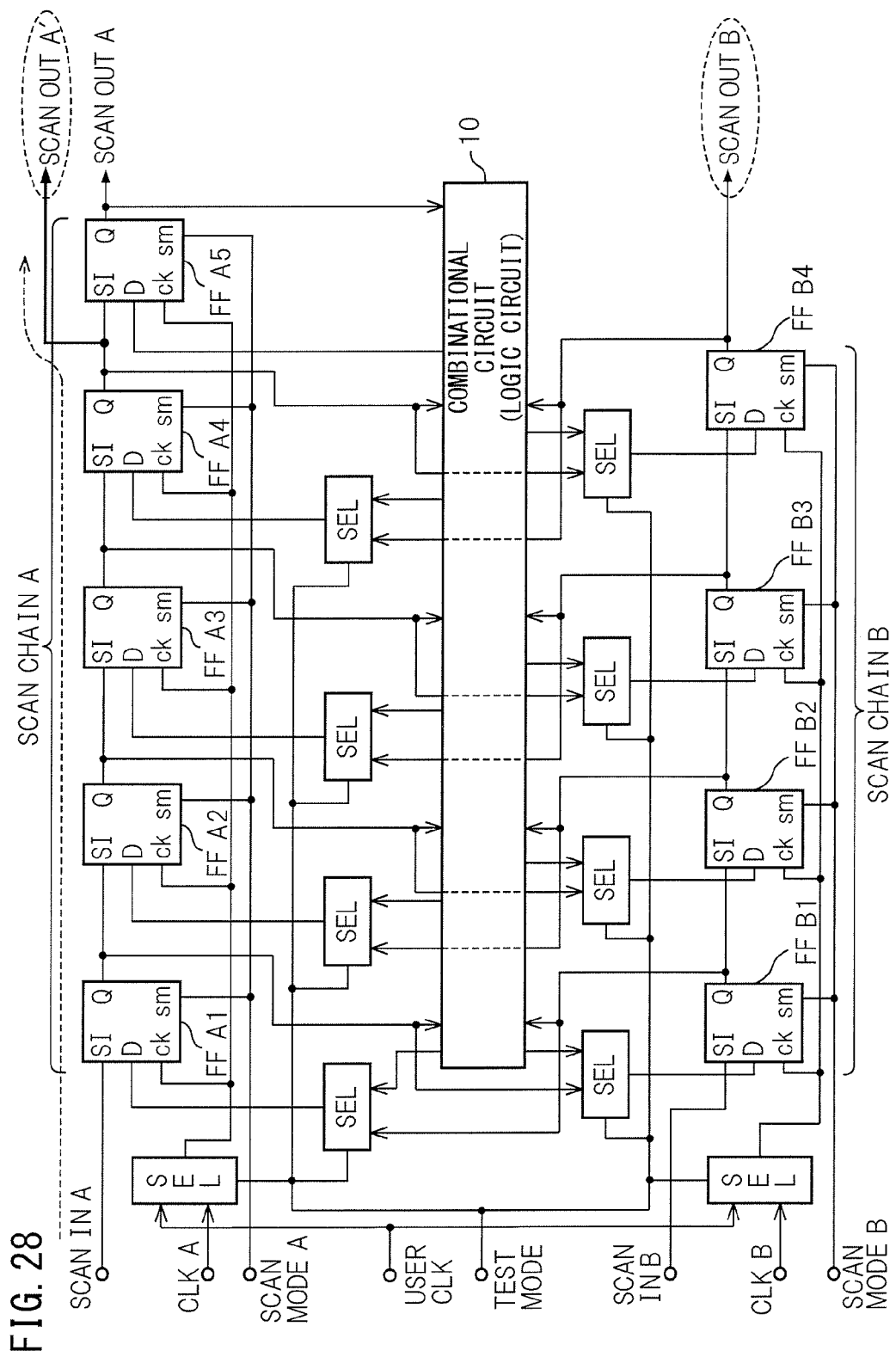

SCAN CIRCUIT, SEMICONDUCTOR DEVICE, AND METHOD FOR TESTING SEMICONDUCTOR DEVICE

CROSS-REFERENCE TO RELATED APPLICATION

This application is based upon and claims the benefit of priority of the prior Japanese Patent Application No. 2013-006208, filed on Jan. 17, 2013, the entire contents of which are incorporated herein by reference.

FIELD

The embodiments discussed herein relate to a scan circuit, a semiconductor, and a method for testing a semiconductor device.

BACKGROUND

In the manufacturing process of semiconductor devices, various kinds of tests are performed in each process and the test results are fed back in order to remove a defective product and to improve yields. For example, an operation test to inspect whether the semiconductor device operates normally and whether the specifications are met is performed and only those having passed the test are shipped.

As the circuit scale of a LSI increases, it becomes difficult to detect the internal operation state, and therefore, a scan circuit is formed within the semiconductor device in order to detect the internal operation state. The scan circuit is a shift register in which flip-flop circuits (FF) are continuously connected in the form of a chain and each FF sends data from the previous stage or data of a combinational circuit (logic circuit) captured at a certain point of time to the next stage in synchronization with a clock. FF in the initial stage sends data input to the input terminal to the next stage in place of the data from the previous stage. FF in the final stage outputs the output data to the output terminal. By utilizing the scan circuit, it is possible to set desired data in the combinational circuit and to output a state (data) of the combinational circuit at a certain point of time to the outside. Due to this, it is possible to know the operational state of the combinational circuit at a desired point of time by operating the combinational circuit from a desired state.

The scan circuit is normally formed by FFs used when performing the normal operation (system operation) within the semiconductor device, however, there is a case where FFs provided in order to form the scan circuit are used. In a large-scale LSI, the number of FFs forming the scan circuit is tremendous and the time taken to shift data from the initial stage to the final stage becomes long, and therefore, there is a case, for example, where a plurality of scan chains are formed. However, if the number of scan chains increases, the number of input and output terminals for the scan chains also increases accordingly and the number of pads also increases, and therefore, the number of scan chains is set appropriately.

In recent years, in the miniaturized LSI whose scale has been increased, the failure of the scan circuit brings about a problem. If a failure occurs in the scan circuit, the logic scan test is no longer significant, and as a result of this, it is difficult to estimate the fault location of LSI. With the test circuit by the normal scan chain, it is difficult to analyze the scan chain failure after the development of LSI, and therefore, the necessity for the scan circuit having a function to make clear the cause of the scan chain failure (resulting from manufacture and resulting from design) is increased.

RELATED DOCUMENTS

[Patent Document 1] Japanese Laid Open Patent Document No. 2008-145204
[Patent Document 2] Japanese Laid Open Patent Document No. 08-36509
[Patent Document 3] Japanese Laid Open Patent Document No. 2011-7761
[Patent Document 4] Japanese Laid Open Patent Document No. 09-311157
[Patent Document 5] Japanese Laid Open Patent Document No. 06-230075

SUMMARY

A scan circuit according to a first aspect of the embodiments, includes: a first scan chain in which a plurality of first flip-flops are connected in series; and a second scan chain in which a plurality of second flip-flops are connected in series. The first scan chain is configured to capture first output data of at least one of the first flip-flops of the second scan chain, and the second scan chain is configured to capture second output data of at least one of the second flip-flops of the first scan chain.

A semiconductor device according to a second aspect of the embodiments, includes: a combinational circuit; and a scan circuit. The scan circuit includes: a first scan chain in which a plurality of first flip-flops are connected in series; and a second scan chain in which a plurality of second flip-flops are connected in series. The first scan chain is configured to capture first output data of at least one of the first flip-flops of the second scan chain, and the second scan chain is configured to capture second output data of at least one of the second flip-flops of the first scan chain.

A method according to a third aspect of the embodiments is for testing a semiconductor device including: a combinational circuit; and a scan circuit. The scan circuit includes a first scan chain in which a plurality of first flip-flops are connected in series; and a second scan chain in which a plurality of second flip-flops are connected in series. The first scan chain is configured to capture first output data of at least one of the first flip-flops of the second scan chain, and the second scan chain is configured to capture second output data of at least one of the second flip-flops of the first scan chain. The method includes: estimating whether there is a fault in the first and second scan chains by successively inputting scan data of "0" or "1" to the first and second scan chains, respectively, and comparing scan data output from the first and second scan chains, respectively, with an expected value; and estimating, by using one of the scan chains in which it is estimated that there is no fault, a type of the fault and an occurrence position of the fault with respect to the other scan chain in which it is estimated that there is a fault.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 6 is a flowchart showing the processing of the test method including the normal test of the combinational circuit and the scan circuit test;

FIG. 7A illustrates the operation to set all the data to "0" at S12 and FIG. 7B illustrates the operation to set all the data to "1" at S13;

FIG. 8A and FIG. 8B are flowcharts showing the normal capture test operations at steps S14 and S15, and FIG. 8A illustrates the operation to set all the data to "0" at S14 and FIG. 8B illustrates the operation to set all the data to "1" at S15;

FIG. 9A illustrates the operation to set data to "0101" at S16 and FIG. 9B illustrates the operation to set data to "1010" at S17;

FIG. 28 is a diagram illustrating a configuration of a semiconductor device of a third embodiment.

DESCRIPTION OF EMBODIMENTS

Before explaining an embodiment, a general scan circuit will be explained.

Figure 1A:
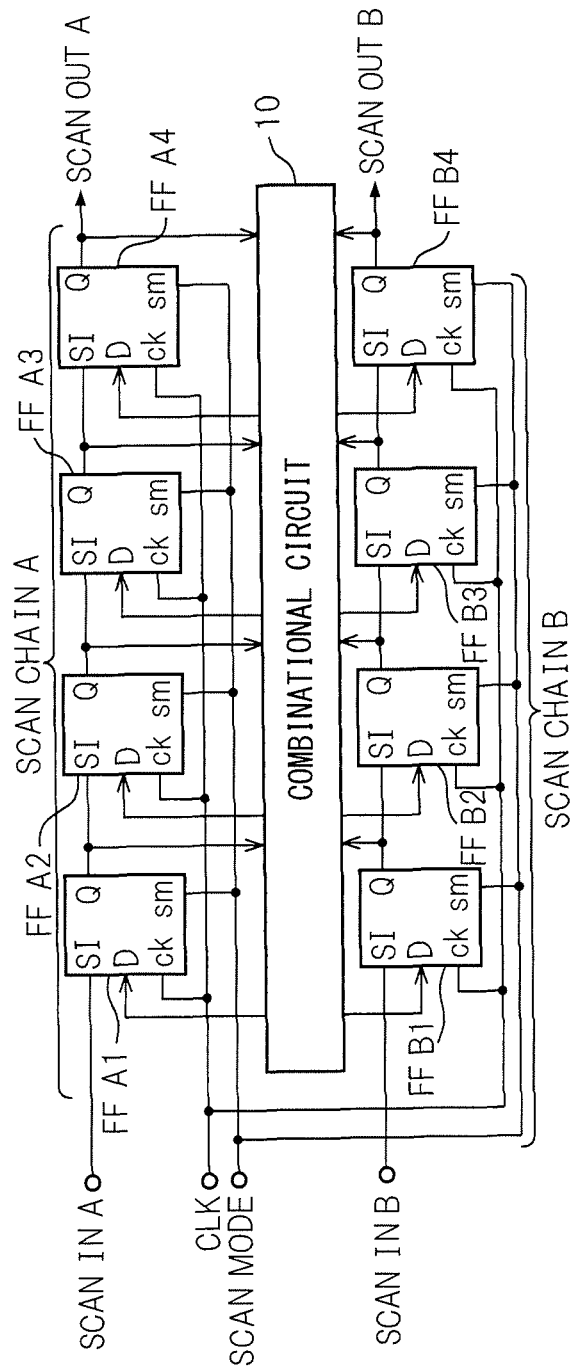
FIG. 1A is a circuit diagram illustrating a basic circuit configuration of a semiconductor device having a general scan circuit.
Figure 1B:
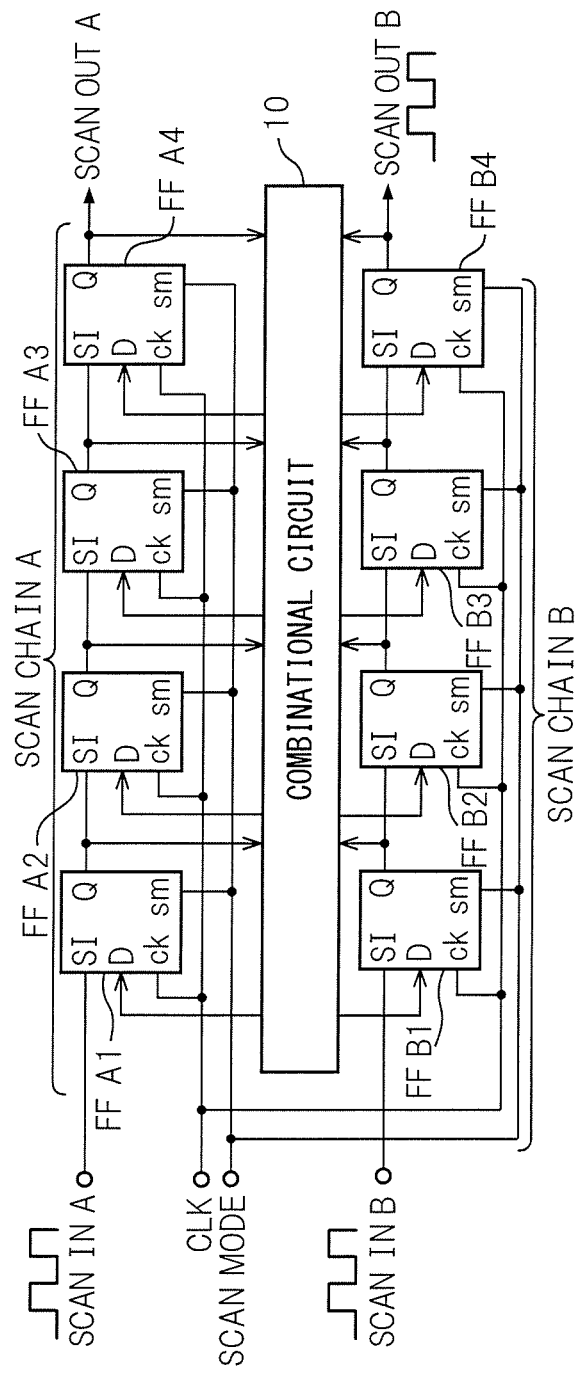
FIG. 1B is an operation explanatory diagram of the circuit in FIG. 1A.

FIG. 1A is a circuit diagram illustrating a basic circuit configuration of a semiconductor device having a general scan circuit. FIG. 1B is an operation explanatory diagram of the circuit in FIG. 1A.

The semiconductor device has a combinational circuit (logic circuit) 10 and a scan circuit. The scan circuit illustrated in FIG. 1A has two scan chains A and B and an example in which four flip-flops (FF) are continuously connected in each scan chain is illustrated.

The scan chain A has four continuously connected flip-flops FF A1 to FF A4 and the scan chain B has four continuously connected flip-flops FF B1 to FF B4. The operation state at the time of test of each FF is controlled by a mode signal SCAN MODE. When SCAN MODE=H, each FF takes in the output data of FF in the previous stage as a scan input SI in synchronization with a clock CLK and outputs it to the subsequent stage. When SCAN MODE=L, each FF latches the data of a certain portion of the combinational circuit (logic circuit) 10 in synchronization with the clock CLK and outputs it to the subsequent stage. FF A1 takes in first scan input data SCN IN A input to a first input terminal as the scan input SI. Similarly, FF B1 takes in second scan input data SCAN IN B input to a second input terminal as the scan input SI. FF A4 outputs output data Q to a first output terminal as first scan output data SCAN OUT A. FF B4 outputs the output data Q to a second output terminal as second scan output data SCAN OUT B.

FIG. 1A illustrates an example of the scan chain in which four FFs are continuously connected, however, normally, it is common that a very large number of FFs are continuously connected to form a scan chain. Further, the number of scan chains is not limited to two.

The operation of the scan circuit is well known, and therefore, explanation is omitted.

Detection of a failure of the scan chain itself in the scan circuit in FIG. 1A is explained. As illustrated in FIG. 1B, as the first scan input data SCAN IN A and the second scan input data SCAN IN B, data that alternately changes to L and H in one clock period (1 UI) is input. If there is no failure in the first and second scan chains A and B, as the first scan output data SCAN OUT A and the second scan output data SCAN OUT B, data that alternately changes to L and H in 1 UI as in the input data is output.

As illustrated in FIG. 1B, the case is considered where the second FF A2 of the first scan chain A becomes the stuck-at 1 (H) failure. It is assumed that there is no failure in the second scan chain B. In this case, even if the scan shift operation is performed, the first scan output data SCAN OUT A becomes stuck at 1. On the other hand, the second scan output data SCAN OUT B is normal and is the same data as the second scan input data SCAN IN B. Consequently, it is clear that a failure has occurred in the first scan chain, however, it is not possible to specify the position of FF in which a failure has occurred.

In the case where FF A2 becomes the stuck-at 0 (L) failure, the first scan output data SCAN OUT A becomes stuck at 0. The above-mentioned phenomenon is the same in the case where a failure has occurred in the second scan chain B. In the case where a failure has occurred in a signal line between FFs, not a failure of FF itself, it is similarly not possible to specify the location of the failure.

As described above, a scan circuit is proposed, which makes it possible to specify the failure location in the scan circuit. However, the proposed scan circuit includes circuits for setting FFs to arbitrary values, registers, circuits for selectively outputting values of FFs to the outside, etc. If the number of stages of the scan chain increases, the scale of the circuit to be added increases, and therefore, it is difficult to implement such a scan circuit. Further, there has been such a problem that it is not possible to sufficiently distinguish the fault location between the FF main body and the wire of the scan chain, and it is not possible to specify FF to be one whose hold time is failed due to the trouble in design or the trouble in manufacture.

Because of this, a scan circuit has been demanded, which is capable of specifying the contents of a failure while suppressing an increase in the scale of the conventional scan circuit as much as possible. The scan circuit of the embodiment explained below suppresses an increase in the circuit scale and specifies the contents of a failure. The first item that is specified is the stuck-at failure (stuck-at fault) of the flip-flops (FFs) configuring the scan chain and the position of the failed FF is also specified. The second item that is specified is the hold time failure (timing error) in the scan shift operation. The third item that is specified is classification between the failure of the FF main body and the failure of wire of the scan chain.

According to embodiments described below, a scan circuit capable of specifying the cause of failure of the scan circuit by suppressing an increase in the circuit scale is described.

Figure 2:
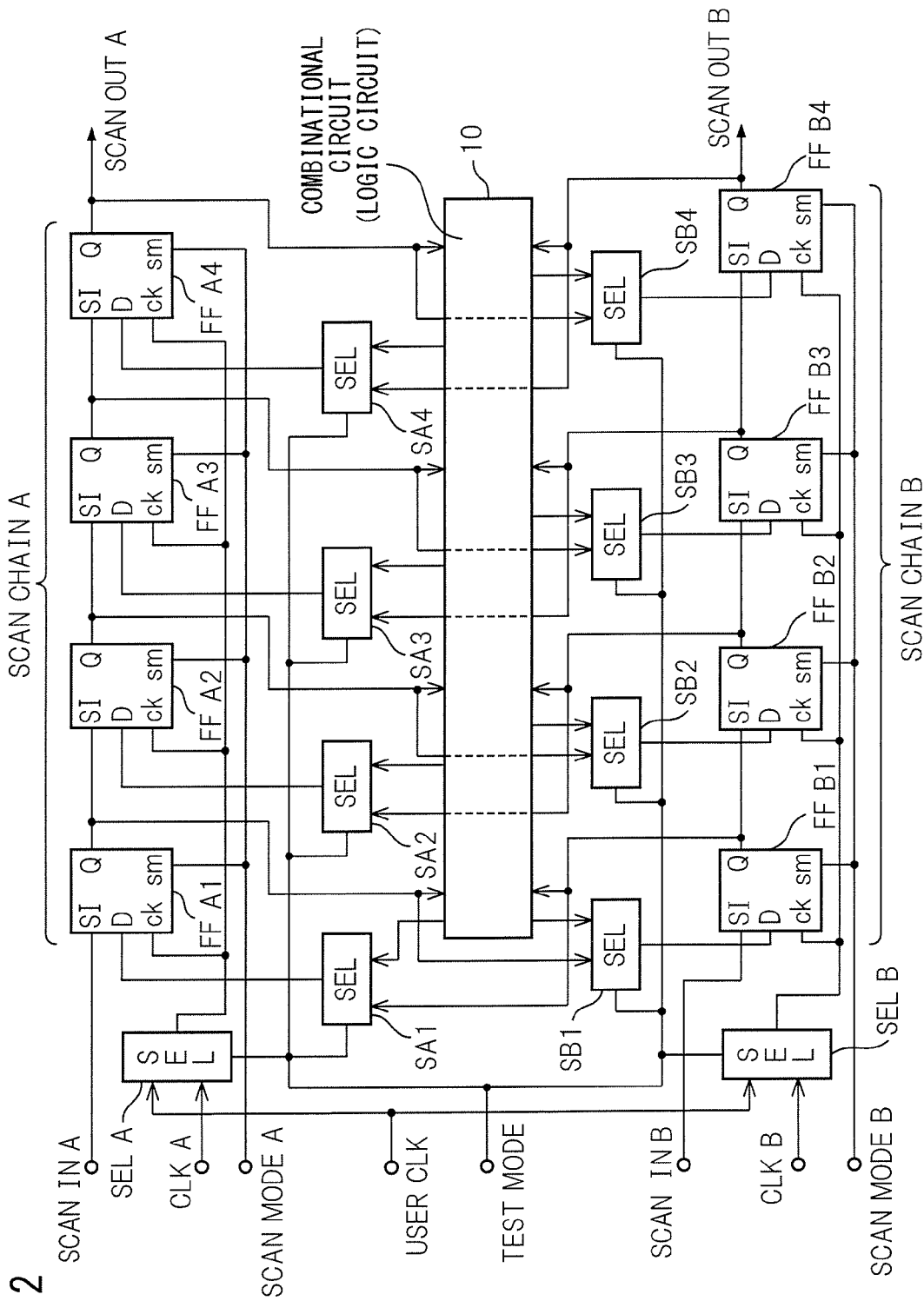
FIG. 2 is a diagram illustrating a configuration of a semiconductor device of a first embodiment.

FIG. 2 is a diagram illustrating a configuration of a semiconductor device of a first embodiment.

The semiconductor device of the first embodiment has the combinational circuit (logic circuit) 10 and a scan circuit. The scan circuit has the two scan chains A and B. In order to make explanation easy, an example is illustrated, in which four flip-flops (FF) are continuously connected in each scan chain, however, the example is not limited to thereto.

The scan chain A has the four flip-flops FF A1 to FF A4 continuously connected and selection circuits (SEL) SEL A and SA1 to SA4. As to the flip-flops FF A1 to FF A4 of the scan chain A, the operation state at the time of test is controlled by a mode signal SCAN MODE A. When SCAN MODE A=H, FF A1 to FF A4 take in the output data of FF in the previous stage as the scan input SI in synchronization with a clock that is input and outputs it to the subsequent stage. When SCAN MODE A=L, FF A1 to FF A4 latch the data at a certain portion of the combinational circuit 10 in synchronization with a clock that is input and outputs it to the subsequent stage. FF A1 takes in the first scan input data SCAN IN A that is input to the first input terminal as the scan input SI. FF A4 outputs the output data Q to the first output terminal as the first scan output data SCAN OUT A.

SEL A switches the clock to be supplied to FF A1 to FF A4 between a user clock USER CLK at the time of normal test and a first scan clock CLK A at the time of scan circuit test in accordance with a test mode signal TEST MODE. SA1 to SA4 switch the data to be supplied to FF A1 to FF A4 between the data of the combinational circuit 10 and the output data of FF B1 to FF B4 in accordance with TEST MODE.

The scan chain B has four flip-flops FF B1 to FF B4 continuously connected and selection circuits (SEL) SEL B and SB1 to SB4. As to the flip-flops FF B1 to FF B4 of the scan chain B, the operation state at the time of test is controlled by a mode signal SCAN MODE B. When SCAN MODE B=H, FF B1 to FF B4 take in the output data of FF in the previous stage as the scan input SI in synchronization with a clock that is input and outputs it to the subsequent stage. When SCAN MODE B=L, FF B1 to FF B4 latch the data at a certain portion of the combinational circuit 10 in synchronization with a clock that is input and outputs it to the subsequent stage. FF B1 takes in the second scan input data SCAN IN B that is input to the second input terminal as the scan input SI. FF B4 outputs the output data Q to the second output terminal as the second scan output data SCAN OUT B.

SEL B switches the clock to be supplied to FF B1 to FF B4 between the user clock USER CLK at the time of normal test and a second scan clock CLK B at the time of scan circuit test in accordance with the test mode signal TEST MODE. SB1 to SB4 switch the data to be supplied to FF B1 to FF B4 between the data of the combinational circuit 10 and the output data of FF A1 to FF A4 in accordance with TEST MODE.

Figure 3:
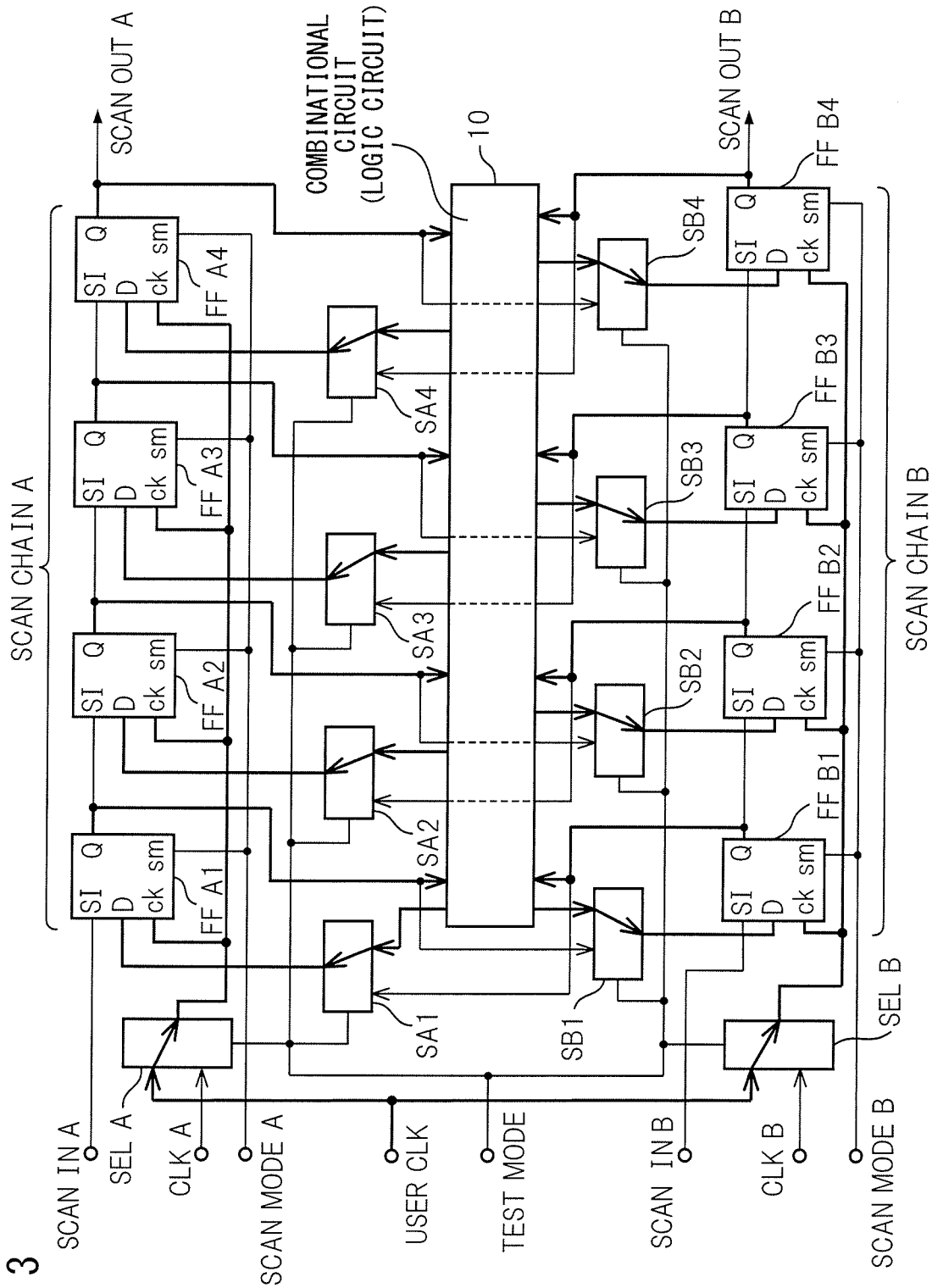
FIG. 3 is a diagram illustrating signal paths in the case where TEST MODE is set to the normal test to perform the test of the combinational circuit in the semiconductor device of the first embodiment.

FIG. 3 is a diagram illustrating signal paths in the case where TEST MODE is set to the normal test to perform the test of the combinational circuit 10 in the semiconductor device of the first embodiment. As illustrated in FIG. 3, to FF A1 to FF 4A and FF B1 to FF B4, the user clock USER CLK is supplied and the scan chains A and B operate in synchronization with the same clock. To the data inputs of FF A1 to FF A4 and FF B1 to FF B4, the data at a certain portion of the combinational circuit 10 is input. Further, the output Q of FF A1 to FF A4 and FF B1 to FF B4 is input to FF in the subsequent stage and to the combinational circuit 10 and it is unlikely that the scan chains A and B input and output data to each other.

It is known that the circuit state in FIG. 3 is substantially the same as the circuit in FIG. 1A, except for SEL A and SA1 to SA4, and SEL B and SB1 to SB4. In other words, the semiconductor device of the first embodiment is in the same state as the normal scan circuit to test the combinational circuit 10 in the state in FIG. 3. Consequently, explanation of the operation at the time of normal test is omitted.

Figure 4:
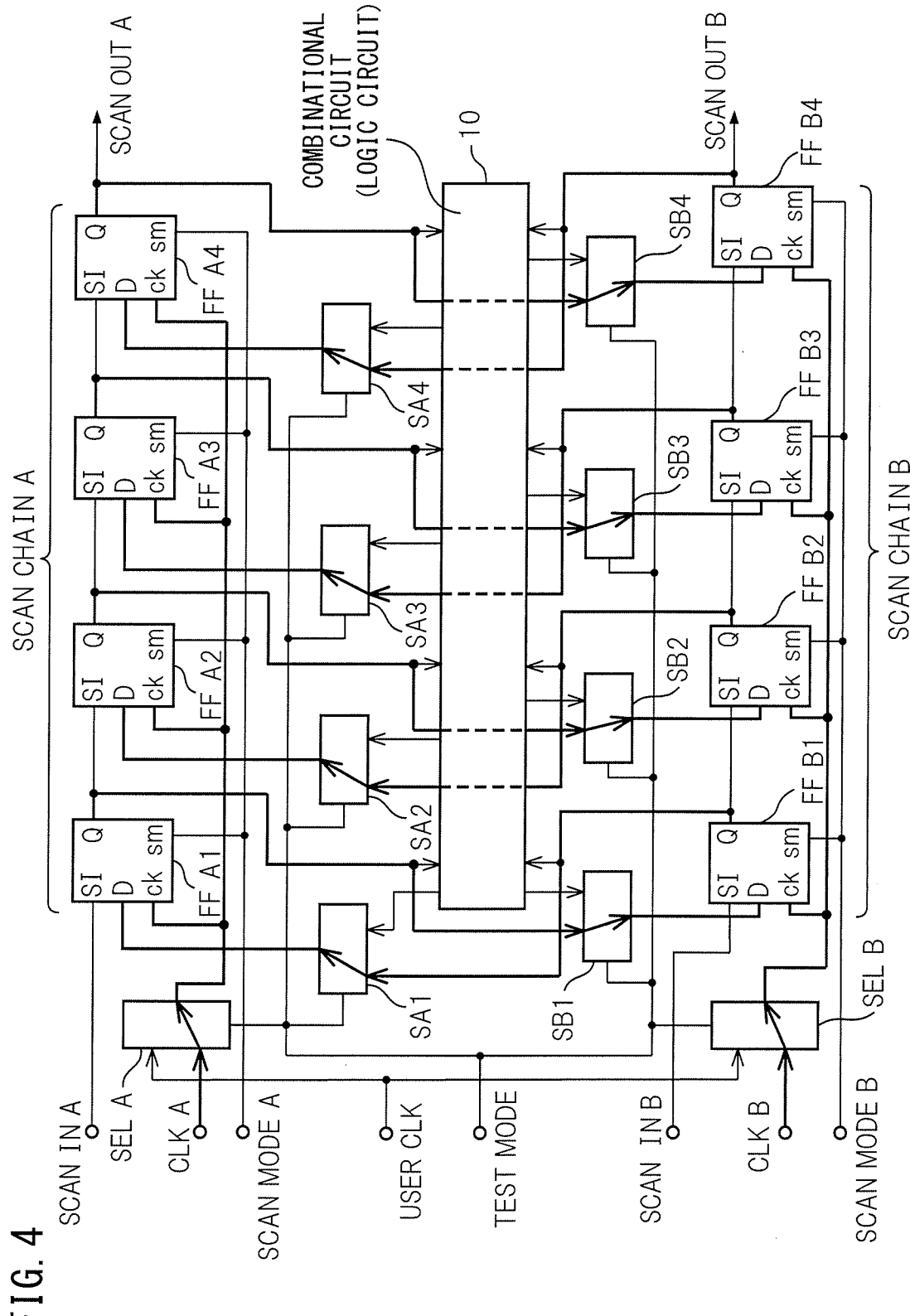
FIG. 4 is a diagram illustrating signal paths in the case where TEST MODE is set to the scan circuit test to perform the test of the scan circuit in the semiconductor device of the first embodiment.

FIG. 4 is a diagram illustrating signal paths in the case where TEST MODE is set to the scan circuit test to perform the test of the scan circuit in the semiconductor device of the first embodiment. As illustrated in FIG. 4, to FF A1 to FF 4A, the first scan clock CLK A is supplied, and to the data inputs of FF A1 to FF A4, the output data of FF B1 to FF B is input. Further, to FF B1 to FF B4, the second scan clock CLK B is supplied and to the data inputs of FF B1 to FF B4, the output data of FF A1 to FF A4 is input.

Figure 5:
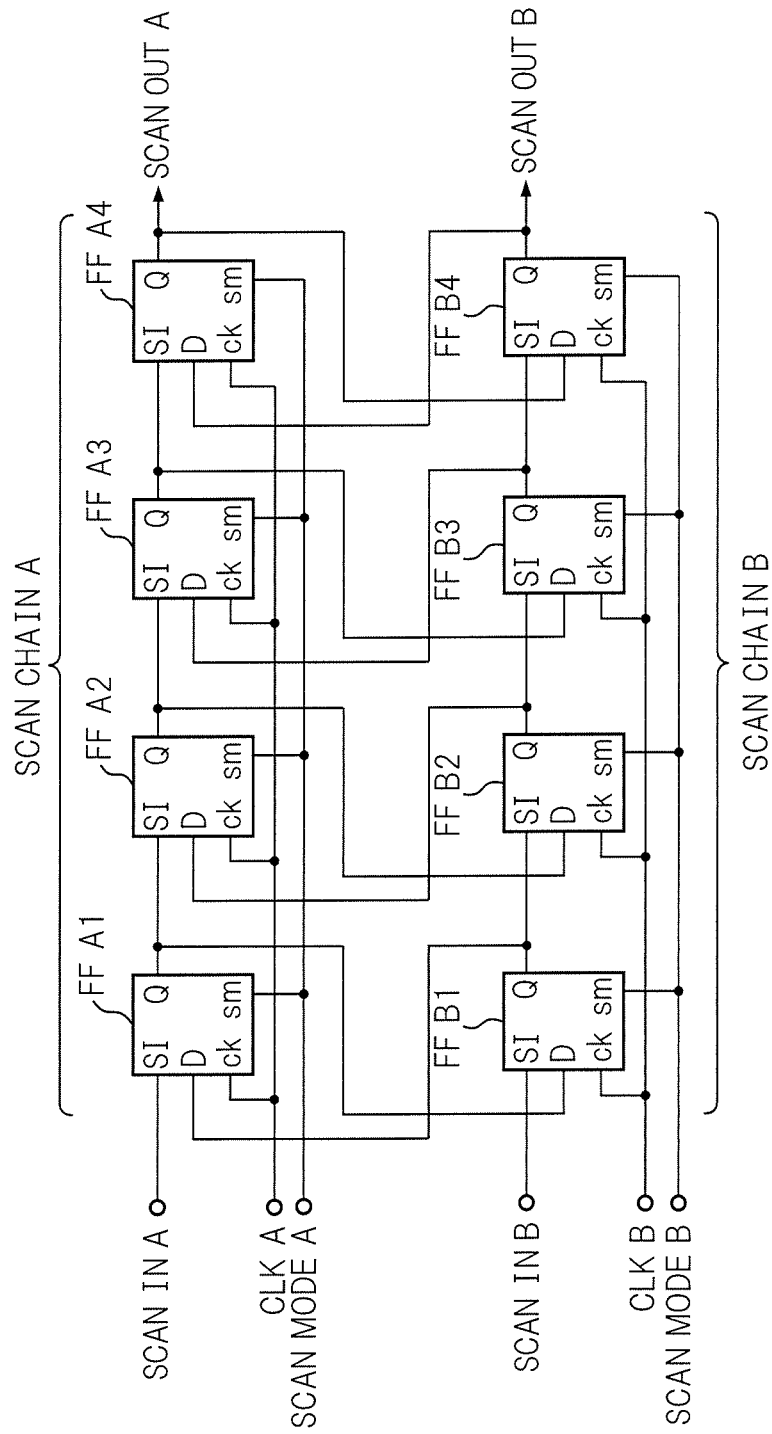
FIG. 5 is a diagram illustrating the semiconductor device of the first embodiment in the state in FIG. 4, excluding the selection circuits, and the combinational circuit.

FIG. 5 is a diagram illustrating the semiconductor device of the first embodiment in the state in FIG. 4, excluding the selection circuits SEL A, SA1 to SA4, SEL B, SB1 to SB4, and the combinational circuit 10. In other words, FIG. 5 is a diagram illustrating the configuration of the substantial scan circuit when performing the test of the scan circuit. Hereinafter, based on FIG. 5, the operation at the time of scan circuit test of the semiconductor device of the first embodiment is explained.

As illustrated in FIG. 5, at the time of scan circuit test, the scan circuit has the configuration in which the outputs Q and data inputs D of the corresponding flip-flops of the scan chains A and B are interconnected. FF A1 to FF A4 of the scan chain A operate in synchronization with the first scan clock CLK A and the operation state is controlled by the mode signal SCAN MODE A. Similarly, the scan chain B operates in synchronization with the second scan clock CLK B and the operation state is controlled by the mode signal SCAN MODE A. Because of this, it is possible for the scan chains A and B to perform the scan shift and capture operation, respectively.

Because the scan circuit of the semiconductor device of the first embodiment has the above functions, by utilizing the scan chain, that normally operates, of the two scan chains, the fault location of the faulty scan chain is estimated.

FIG. 6 is a flowchart showing the processing of the test method including the normal test of the combinational circuit 10 and the scan circuit test. In this test method, estimation of the permanent fault (stuck-at fault) and the hold time failure of the scan circuit is also performed.

At step S11, the normal scan circuit test is performed and the pass/fail determination of the two scan chains A and B is performed. Specifically, whether all FFs shift "0" and outputs whose values are all "0" are obtained and all FFs shift "1" and outputs whose values are all "1" are obtained is determined in the two scan chains A and B, respectively. In the case where the determination result is passed, it is determined that the scan circuit operates normally and the procedure is exited. In the case where the determination result is fail, it is made clear that one of the scan chains A and B is failed, and then, the procedure proceeds to step S12.

At step S12, the mutual capture test, in which all the data is set to "0" and the capture operation is performed twice between the scan chains A and B, is performed and pass/fail is determined. The contents of the test will be described later. In the case where the determination result is fail at S12, it is determined that there is a possibility of the stuck-at 1 fault, in which the flip-flop (FF) corresponding to the address at which the failure has occurred always outputs "1", and the procedure is exited. In the case where the determination result is passed at S12, the procedure proceeds to step S13.

At step S13, the mutual capture test, in which all the data is set to "1" and the capture operation is performed twice between the scan chains A and B, is performed and pass/fail is determined. The contents of the test will be described later. In the case where the determination result is fail at S13, it is determined that there is a possibility of the stuck-at 0 fault, in which the flip-flop (FF) corresponding to the address at which the failure has occurred always outputs "0", and the procedure is exited. In the case where the determination result is passed at S13, the procedure proceeds to step S14

At S12 and S13, if a failed FF exists, the position (address) of the failed FF is specified.

At step S14, the normal capture test, in which all the data is set to "0" and the capture operation is performed once between the scan chains A and B, is performed and pass/fail is determined. The contents of the test will be described later. In the case where the determination result is fail at S14, it is determined that there is a possibility of the stuck-at 1 fault in the wire between FFs at the boundary between pass and fail, and the procedure is exited. In the case where the determination result is passed at S14, the procedure further proceeds to step S15.

At step S15, the normal capture test, in which all the data is set to "1" and the capture operation is performed once between the scan chains A and B, is performed and pass/fail is determined. The contents of the test will be described later. In the case where the determination result is fail at S15, it is determined that there is a possibility of the stuck-at 0 fault in the wire between FFs at the boundary between pass and fail, and the procedure is exited. In the case where the determination result is passed at S15, the procedure proceeds to step S16.

At step S16, the normal capture test, in which all the data is set to "0101 . . . " and the capture operation is performed once between the scan chains A and B, is performed, pass/fail is determined, then the determination result is stored, and the procedure proceeds to step S17. The contents of the test will be described later.

At step S17, the normal capture test, in which all the data is set to "1010 . . . " and the capture operation is performed once between the scan chains A and B, is performed, pass/fail is determined, then the determination result is stored, and the procedure proceeds to step S18. The contents of the test will be described later.

At step S18, whether both the determination results at S16 and S17 are passed is determined and if both are passed, it is determined that there is no fault in the scan circuit and this is contradictory to the result at S11, and therefore, it is determined that the cause of the fault is unknown and the procedure is exited. In the case where at least one of the determination results at S16 and S17 is fail, the procedure proceeds to step S19.

At step S19, the addresses of the failures, which are the determination results at S16 and S17, are merged. Then, it is determined that there is a possibility of the hold failure (in which data is not held for a certain hold time) of FF at the pass/fail boundary of the merged address.

Next, the operations at steps S12 to S17 are explained in detail with reference to FIG. 7A to FIG. 9B. FIG. 7A to FIG. 9B illustrate examples in the case where whether there is a fault in the scan chain A is tested. That there is a fault in the scan chain A is already determined at S11 and by utilizing the normal scan chain B, the fault location of the scan chain A is specified.

Figure 7A:
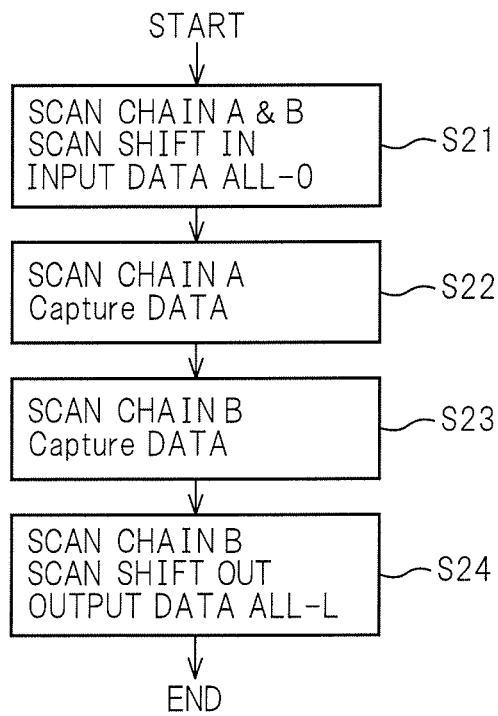
FIG. 7A and FIG. 7B are flowcharts showing the mutual capture test operations as steps S12 and S13.
Figure 7B:
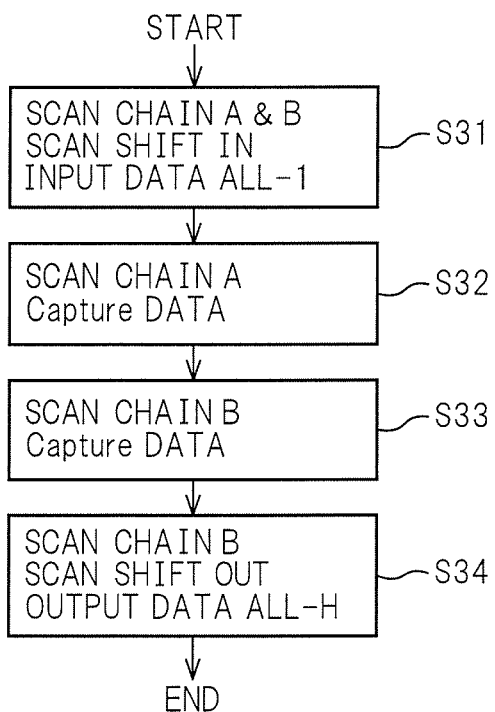

FIG. 7A and FIG. 7B are flowcharts showing the mutual capture test operations as steps S12 and S13, and FIG. 7A illustrates the operation to set all the data to "0" at S12 and FIG. 7B illustrates the operation to set all the data to "1" at S13.

At step S21, in the state where "0" is supplied as SCAN IN A and SCAN IN B, CLK A and CLK B are supplied (here, clocks corresponding to four clocks are supplied), and "0" is set to FF A1 to FF A4 and FF B1 to FF B4 of the scan chains A and B.

At step S22, FF A1 to FF A4 of the scan chain A capture the output data of FF B1 to FF B4 of the scan chain B.

At step S23, FF B1 to FF B4 of the scan chain B capture the output data of FF A1 to FF A4 of the scan chain A.

At step S24, the scan chain B outputs the data held in FF B1 to FF B4 as SCAN OUT B and compares the output data with the expected value (in this case, "0"). If the value (in this case, "1") different from the expected value is output, from the order of outputs, the position of FF with the stuck-at 1 fault of the scan chain A is specified.

If it is already determined that the scan chain B has the stuck-at 1 fault, the test is performed after reversing the relationship between the scan chains A and B at S22 to S24.

At step S31, in the state where "1" is supplied as SCAN IN A and SCAN IN B, CLK A and CLK B are supplied (here, clocks corresponding to four clocks are supplied), and "1" is set to FF A1 to FF A4 and FF B1 to FF B4 of the scan chains A and B.

At step S32, FF A1 to FF A4 of the scan chain A capture the output data of FF B1 to FF B4 of the scan chain B.

At step S33, FF B1 to FF B4 of the scan chain B capture the output data of FF A1 to FF A4 of the scan chain A.

At step S34, the scan chain B outputs the data held in FF B1 to FF B4 as SCAN OUT B and compares the output data with the expected value (in this case "1"). If the value (in this case "0") different from the expected value is output, from the order of outputs, the position of FF with the stuck-at 0 fault of the scan chain A is specified.

If it is already determined that the scan chain B has the stuck-at 0 fault, the test is performed after reversing the relationship between the scan chains A and B at S32 to S34.

FIG. 8A and FIG. 8B are flowcharts showing the normal capture test operations at steps S14 and S15, and FIG. 8A illustrates the operation to set all of the data to "0" at S14 and FIG. 8B illustrates the operation to set all the data to "1" at S15.

At step S41, in the state where "0" is supplied as SCAN IN A and SCAN IN B, CLK A and CLK B are supplied (here, clocks corresponding to four clocks are supplied), and "0" is set to FF A1 to FF A4 and FF B1 to FF B4 of the scan chains A and B.

At step S42, FF B1 to FF B4 of the scan chain B capture the output data of FF A1 to FF A4 of the scan chain A.

At step S43, the scan chain B outputs the data held in FF B1 to FF B4 as SCAN OUT B and compares the output data with the expected value (in this case "0"). If the value (in this case "1") different from the expected value is output, from the order of outputs, the boundary position of pass/fail of the scan chain A with the stuck-at 1 fault is specified.

If it is already determined that the scan chain B has the stuck-at 1 fault, the test is performed after reversing the relationship between the scan chains A and B at S42 and S43.

At step S51, in the state where "1" is supplied as SCAN IN A and SCAN IN B, CLK A and CLK B are supplied (here, clocks corresponding to four clocks are supplied), and "1" is set to FF A1 to FF A4 and FF B1 to FF B4 of the scan chains A and B.

At step S52, FF B1 to FF B4 of the scan chain B capture the output data of FF A1 to FF A4 of the scan chain A.

At step S53, the scan chain B outputs the data held in FF B1 to FF B4 as SCAN OUT B and compares the output data with the expected value (in this case "1"). If the value (in this case "0") different from the expected value is output, from the order of outputs, the boundary position of pass/fail of the scan chain A with the stuck-at 1 fault is specified.

If it is already determined that the scan chain B has the stuck-at 1 fault, the test is performed after reversing the relationship between the scan chains A and B at S52 and S53.

Figure 9A:
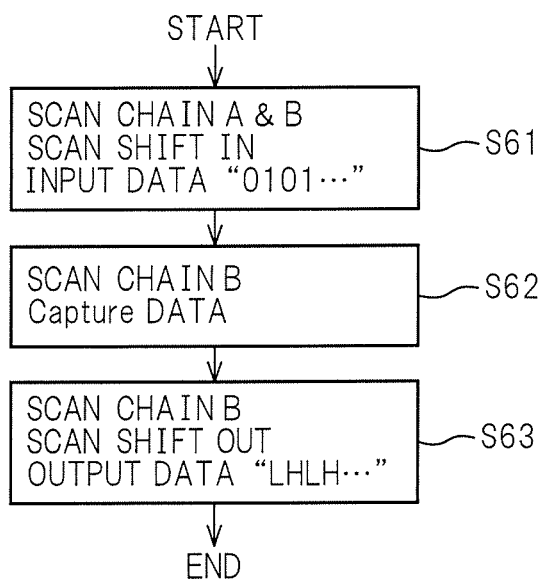
FIG. 9A and FIG. 9B are flowcharts showing the normal capture test operations at steps S16 and S17.
Figure 9B:
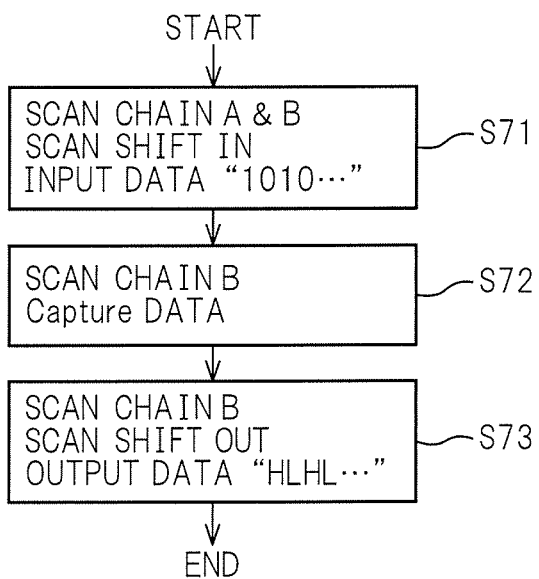

FIG. 9A and FIG. 9B are flowcharts showing the normal capture test operations at steps S16 and S17, and FIG. 9A illustrates the operation to set data to "0101" at S16 and FIG. 9B illustrates the operation to set data to "1010" at S17.

At step S61, as SCAN IN A, "0101" is supplied in synchronization with CLK A (here, clocks corresponding to four clocks are supplied), and "0101" is set to FF A1 to FF A4 of the scan chain A. Any data may be set to the scan chain B. In FIG. 9A, as SCAN IN B, "0101" is supplied in synchronization with CLK B and "0101" is set to FF B1 to FF B4 of the scan chain B. However, it may also be possible to supply "0000", etc., as SCAN IN B to set "0000" to FF B1 to FF B4.

At step S62, FF B1 to FF B4 of the scan chain B capture the output data of FF A1 to FF A4 of the scan chain A.

At step S63, the scan chain B outputs the data held in FF B1 to FF B4 as SCAN OUT B and compares the output data with the expected value (in this case "0101"). If the value different from the expected value is output, from the order of outputs, the position of failed FF of the scan chain A with the hold fault is specified.

If it is already determined that the scan chain B has a fault, the test is performed after reversing the relationship between the scan chains A and B at S62 and S63.

At step S71, as SCAN IN A, "1010" is supplied in synchronization with CLK A (here, clocks corresponding to four clocks are supplied), and "1010" is set to FF A1 to FF A4 of the scan chain A. Any data may be set to the scan chain B. In FIG. 9B, as SCAN IN B, "1010" is supplied in synchronization with CLK B and "1010" is set to FF B1 to FF B4 of the scan chain B. However, it may also be possible to supply "0000", etc., as SCAN IN B to set "0000" to FF B1 to FF B4.

At step S72, FF B1 to FF B4 of the scan chain B capture the output data of FF A1 to FF A4 of the scan chain A.

At step S73, the scan chain B outputs the data held in FF B1 to FF B4 as SCAN OUT B and compares the output data with the expected value (in this case "1010"). If the value different from the expected value is output, from the order of outputs, the position of failed FF of the scan chain A with the hold fault is specified.

If it is already determined that the scan chain B has a fault, the test is performed after reversing the relationship between the scan chains A and B at S62 and S63.

Next, a change in data of each part at S11 to S17 in the case where a fault has occurred in the scan chain in the semiconductor device of the first embodiment is explained.

Figure 10:
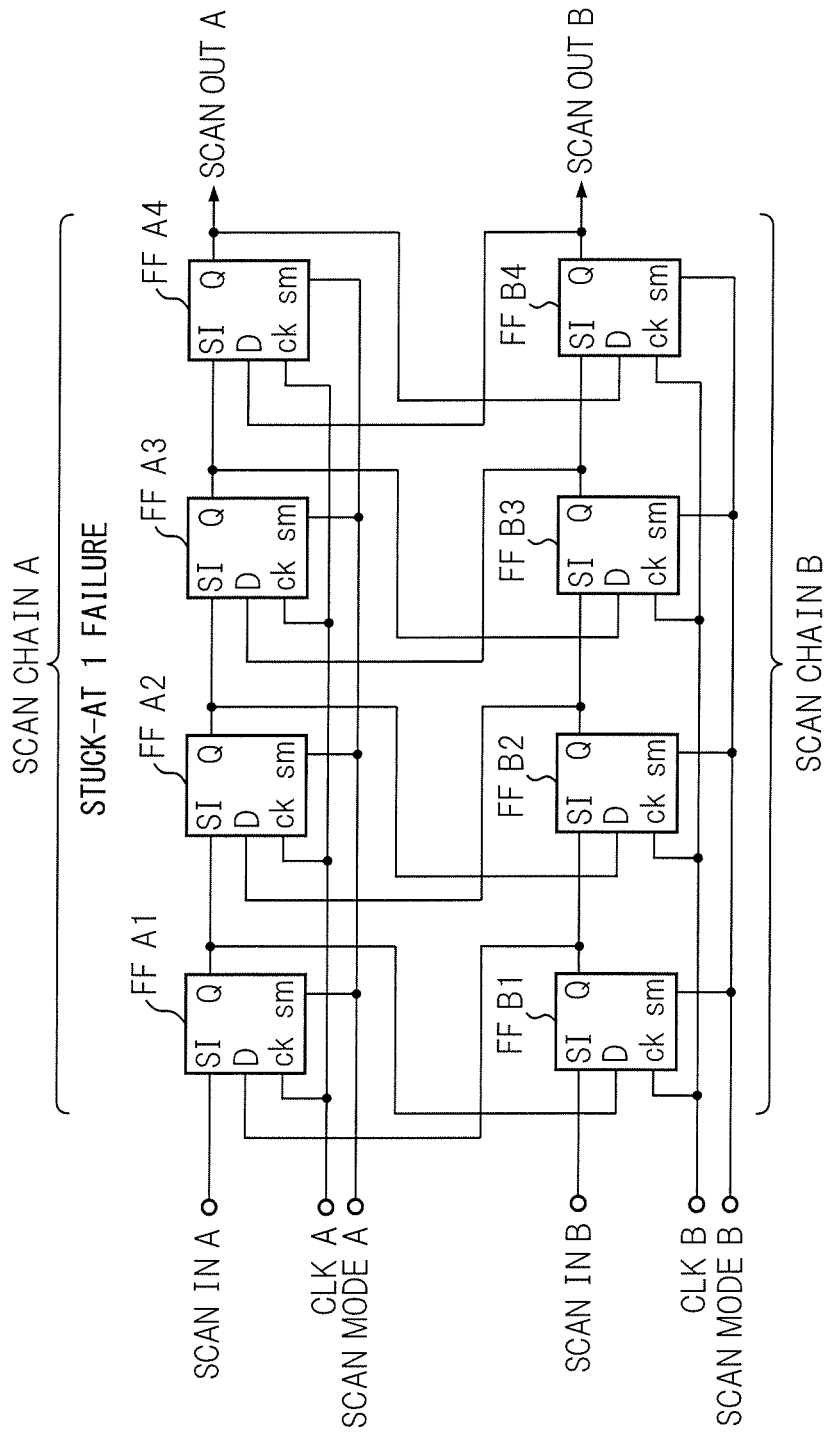
FIG. 10 illustrates the case where the stuck-at 1 fault has occurred in FF A2 in the semiconductor device of the first embodiment.

FIG. 10 illustrates the case where the stuck-at 1 fault has occurred in FF A2 in the semiconductor device of the first embodiment.

Figure 11:
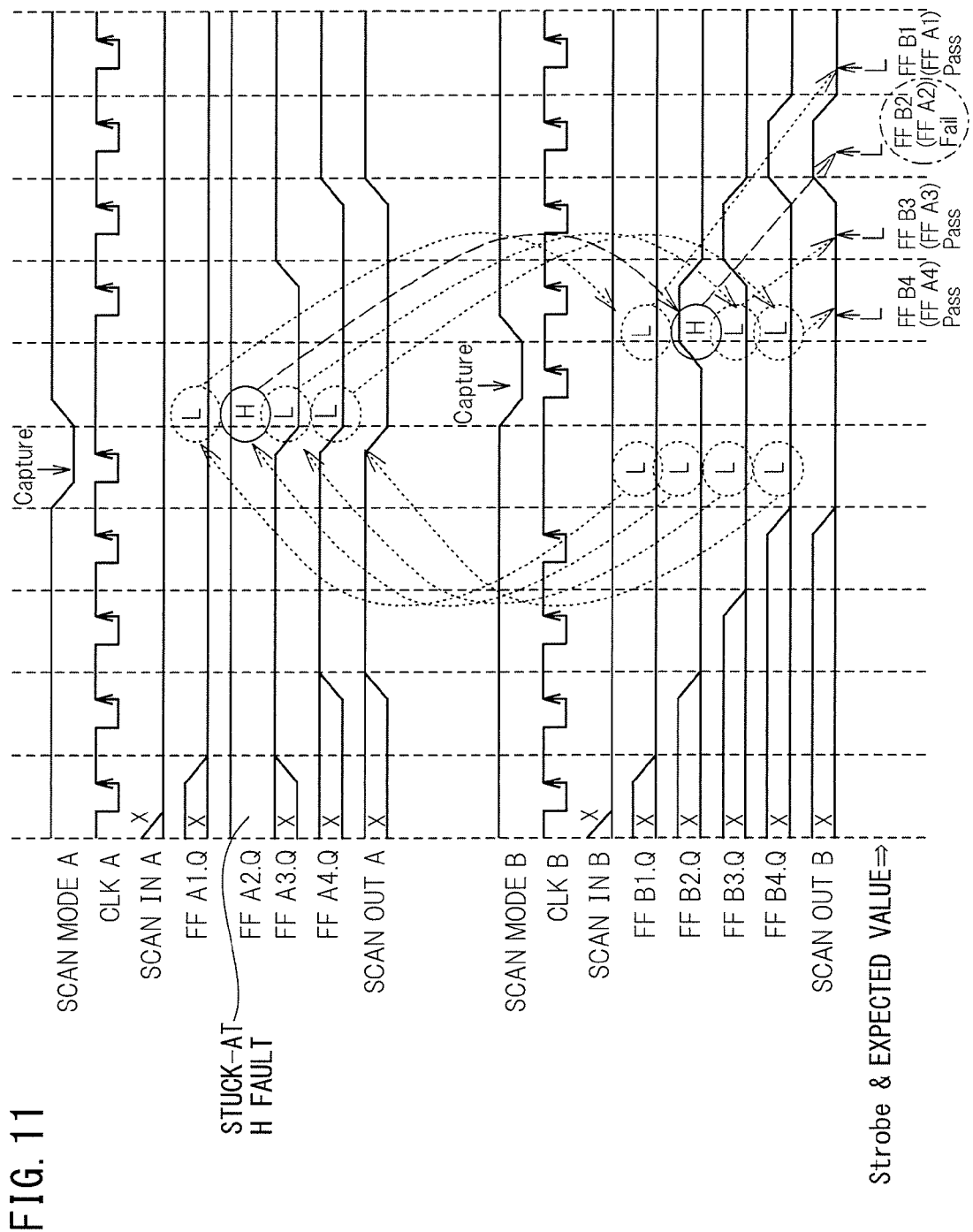
FIG. 11 is a time chart showing a change in data of each part in the case where the mutual capture test in which all of the data is set to "0" at S12 is performed for the semiconductor device in FIG. 10.

FIG. 11 is a time chart showing a change in data of each part in the case where the mutual capture test in which all the data is set to "0" at S12 is performed for the semiconductor device in FIG. 10.

As illustrated schematically, by supplying CLK A and CLK B (here, clocks corresponding to four clocks are supplied) in the state where "0 (L)" is supplied as SCAN IN A and SCAN IN B, "0" is set to FF A1 to FF A4 and FF B1 to FF B4 of the scan chains A and B. In contrast, the scan chain B is normal and FF B1 to FF B4 enter the state of holding and outputting "0". However, the scan chain A has the stuck-at 1 fault in FF A2, and therefore, FF A1 is set to "0", however, FF A2 is "1 (H)" and the shift data that FF A3 and FF A4 after FF A2 receive is "1", and therefore, they are set to "1".

At step S22, FF A1 to FF A4 of the scan chain A capture the output data of FF B1 to FF B4 of the scan chain B. Because of this, FF A1, FF A3, and FF A4 enter the state of holding "0" and outputting "0", however, FF A2 has the stuck-at 1 fault, and therefore, enters the state of outputting "1".

At step S23, FF B1 to FF B4 of the scan chain B capture the output data of FF A1 to FF A4 of the scan chain A. Because of this, FF B1, FF B3, and FF B4 enter the state of holding "0" and outputting "0", however, FF B2 enters the state of holding "1" and outputting "1".

At step S24, the scan chain B outputs the data held in FF B1 to FF B4 as SCAN OUT B and the output data becomes "0100 (LHLL)". If the output data is compared with the expected value (in this case, "0000 (LLLL)", the second output data does not agree with the expected value and it is specified that the possibility that FF A2 of the scan chain A has the stuck-at 1 fault is strong.

Figure 12:
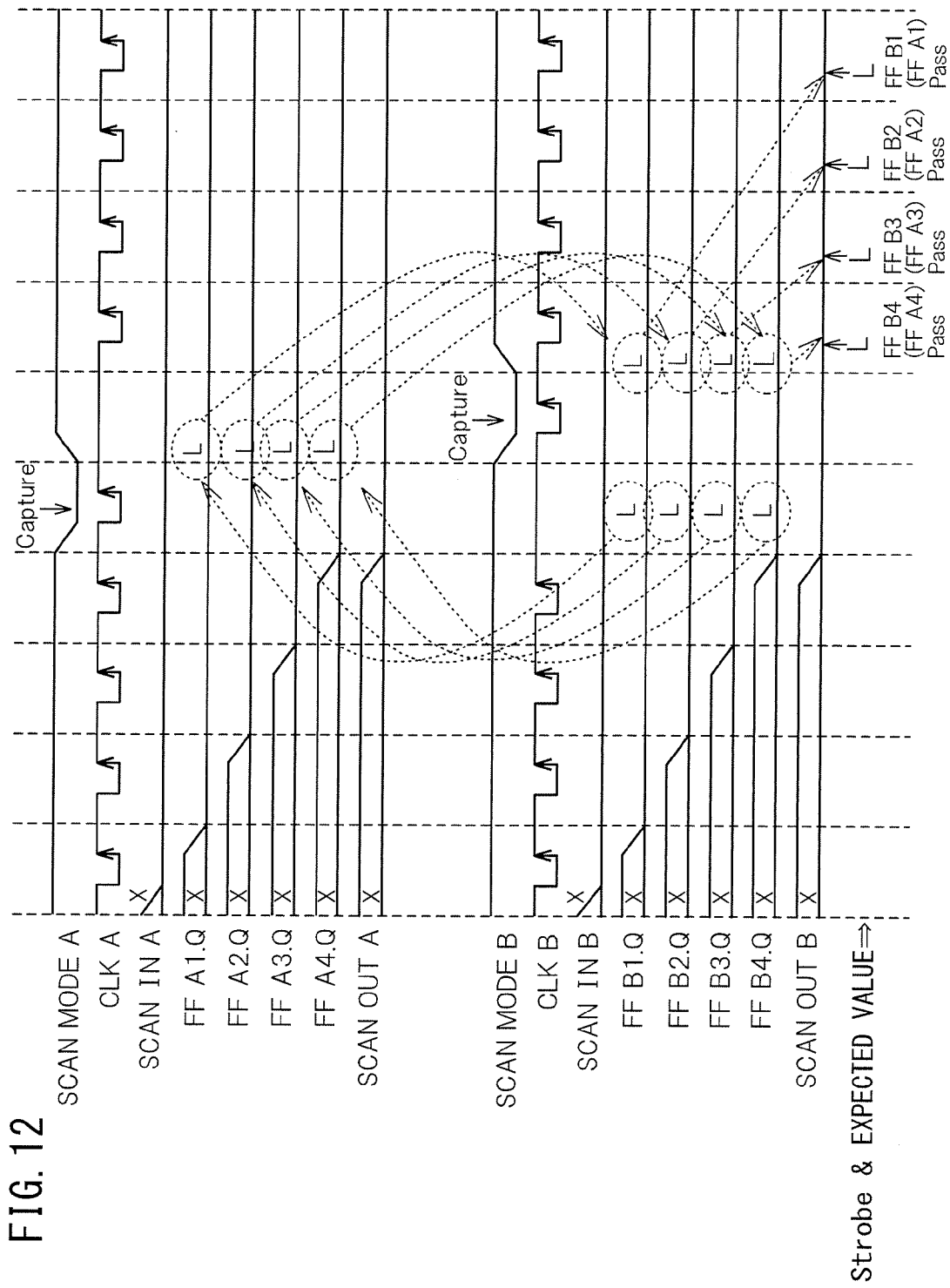
FIG. 12 is a time chart corresponding to that in FIG. 11 in the case where FF A2 is normal.

For reference, the time chart corresponding to that in FIG. 11 in the case where FF A2 is normal is illustrated in FIG. 12. The output data to be output as SCAN OUT B is all 0 (L) and they agree with the expected value 0.

Figure 13:
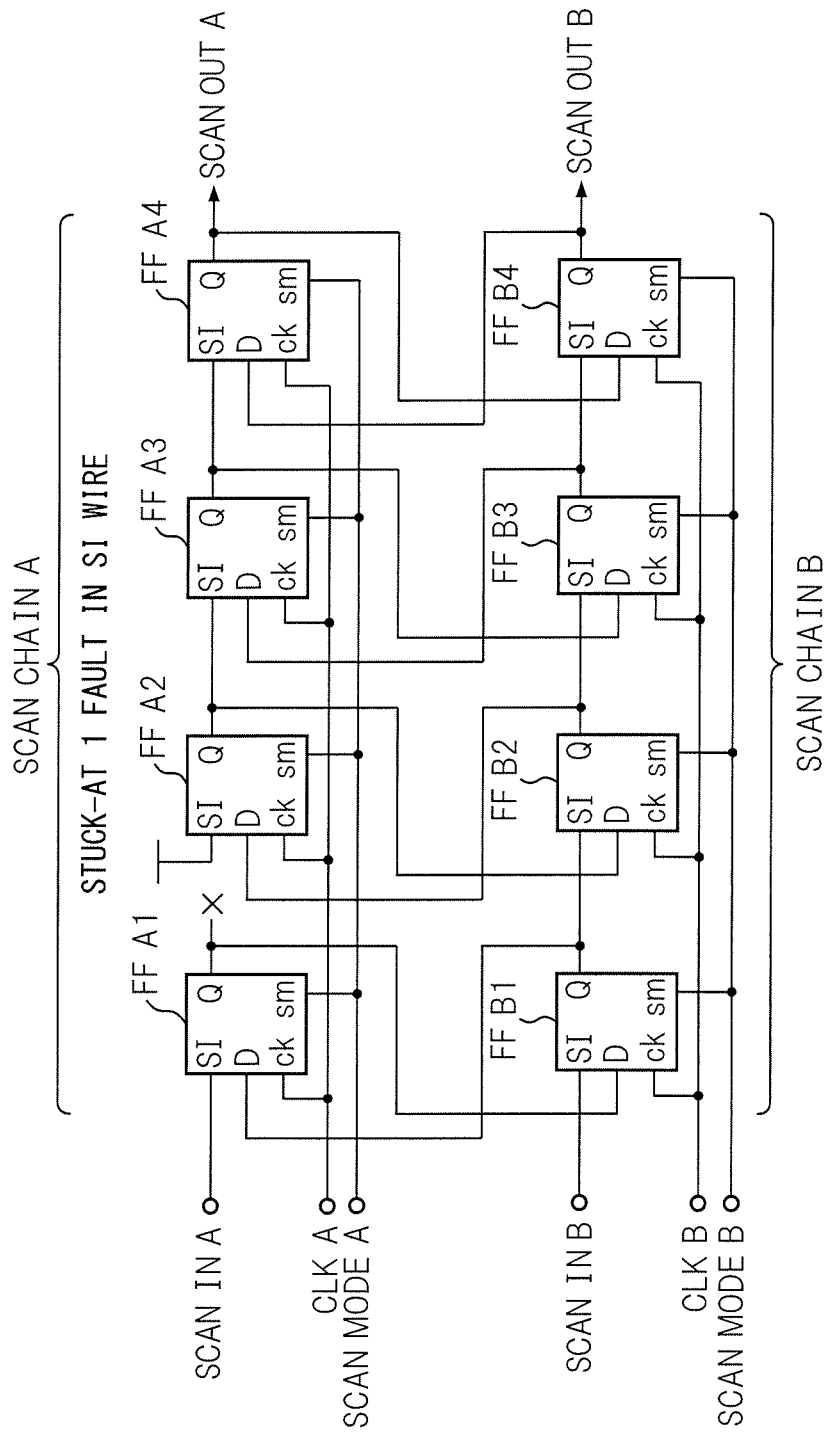
FIG. 13 illustrates the case where the stuck-at 1 fault has occurred in the wire between FF A1 and FF A2 in the semiconductor device of the first embodiment.

FIG. 13 illustrates the case where the stuck-at 1 fault has occurred in the wire between FF A1 and FF A2 in the semiconductor device of the first embodiment.

Figure 14:
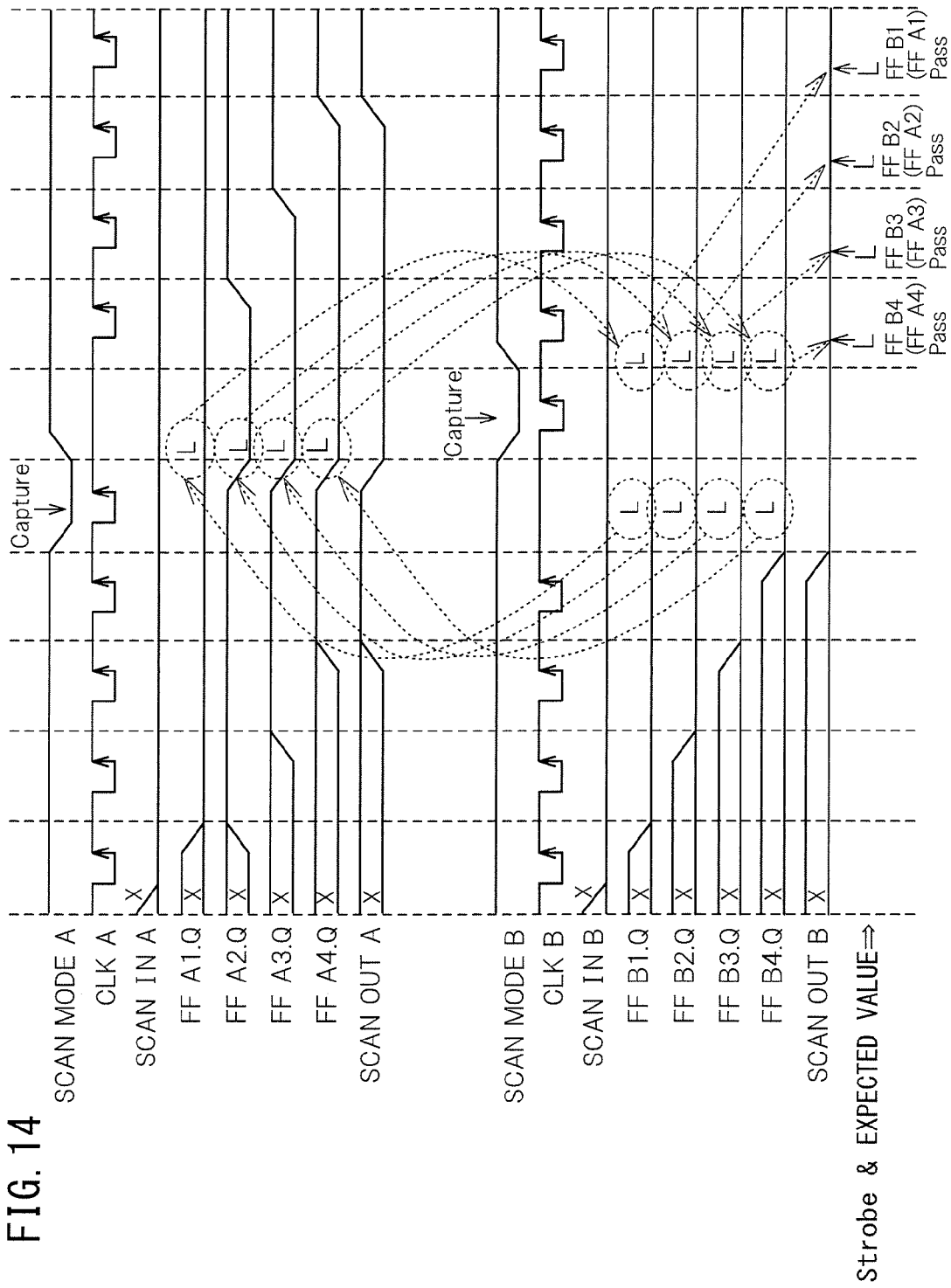
FIG. 14 is a time chart showing a change in data of each part in the case where the mutual capture test in which all of the data is set to "0" at S12 is performed for the semiconductor device in FIG. 13.

FIG. 14 is a time chart showing a change in data of each part in the case where the mutual capture test in which all the data is set to "0" at S12 is performed for the semiconductor device in FIG. 13.

As illustrated schematically, at S21, by supplying CLK A and CLK B (here, clocks corresponding to four clocks are supplied) in the state where "0 (L)" is supplied as SCAN IN A and SCAN IN B, "0" is set to FF A1 to FF A4 and FF B1 to FF B4 of the scan chains A and B. In contrast, the scan chain B is normal and FF B1 to FF B4 enter the state of holding and outputting "0". However, in the scan chain A, the stuck-at 1 fault has occurred in the wire between FF A1 and FF A2, and therefore, FF A1 is set to "0", however, FF A2 is "1 (H)" and the shift data that FF A3 and FF A4 after FF A2 receive from FF A2 is "1", and therefore, they are set to "1".

At step S22, FF A1 to FF A4 of the scan chain A capture the output data of FF B1 to FF B4 of the scan chain B. Because of this, FF A1 to FF A4 are all normal, and therefore, enter the state of holding "0" and outputting "0".

At step S23, FF B1 to FF B4 of the scan chain B capture the output data of FF A1 to FF A4 of the scan chain A. Because of this, FF B1 to FF B4 enter the state of holding "0" and outputting "0".

At step S24, the scan chain B outputs the data held in FF B1 to FF B4 as SCAN OUT B and the output data becomes "0000 (LLLL)", and therefore, they all agree with the expected value. Consequently, it is not possible to specify that the stuck-at 1 fault has occurred in the wire between FF A1 and FF A2 of the scan chain A.

Figure 15:
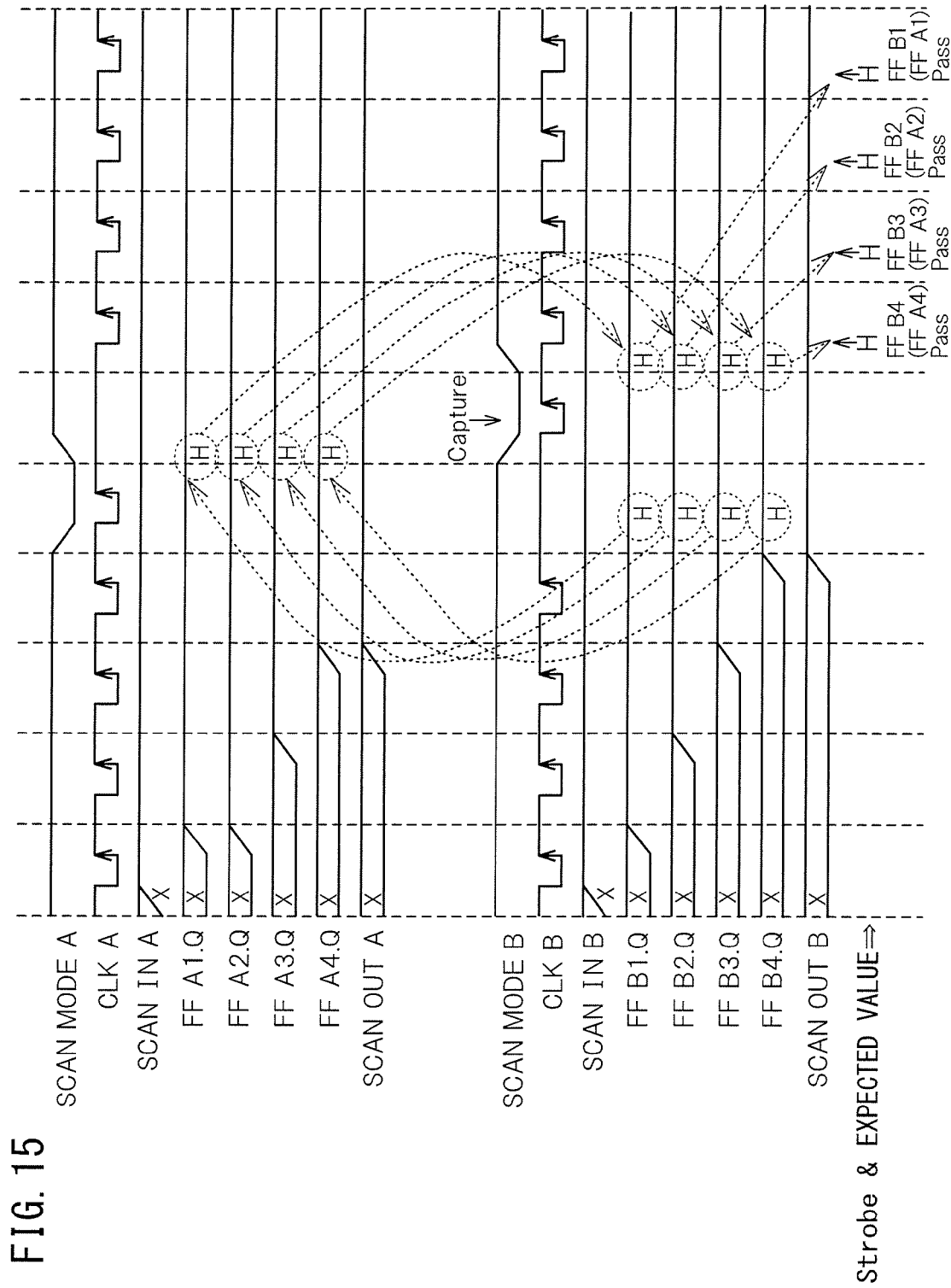
FIG. 15 is a time chart showing a change in data of each part in the case where the mutual capture test in which all of the data is set to "1" at S13 is performed for the semiconductor device in FIG. 13.

FIG. 15 is a time chart showing a change in data of each part in the case where the mutual capture test in which all the data is set to "1" at S13 is performed for the semiconductor device in FIG. 13.

As illustrated schematically, at S31, by supplying CLK A and CLK B (here, clocks corresponding to four clocks are supplied) in the state where "1 (H)" is supplied as SCAN IN A and SCAN IN B, "1" is set to FF A1 to FF A4 and FF B1 to FF B4 of the scan chains A and B at S31. In contrast, the scan chain B is normal and FF B1 to FF B4 enter the state of holding and outputting "1". On the other hand, in the scan chain A, the stuck-at 1 fault has occurred in the wire between FF A1 and FF A2, however, FF A2 receives "1 (H)" as the shift data and the output also becomes 1, and therefore, FF A3 and FF A4 are set to "1".

At step S32, FF A1 to FF A4 of the scan chain A capture the output data of FF B1 to FF B4 of the scan chain B. Because of this, FF A1 to FF A4 are all normal, and therefore, enter the state of holding "1" and outputting "1".

At step S33, FF B1 to FF B4 of the scan chain B capture the output data of FF A1 to FF A4 of the scan chain A. Because of this, FF B1 to FF B4 enter the state of holding "1" and outputting "1".

At step S34, the scan chain B outputs the data held in FF B1 to FF B4 as SCAN OUT B and the output data becomes "1111 (HHHH)", and therefore, they all agree with the expected value. Consequently, it is not possible to specify that the stuck-at 1 fault has occurred in the wire between FF A1 and FF A2.

Figure 16:
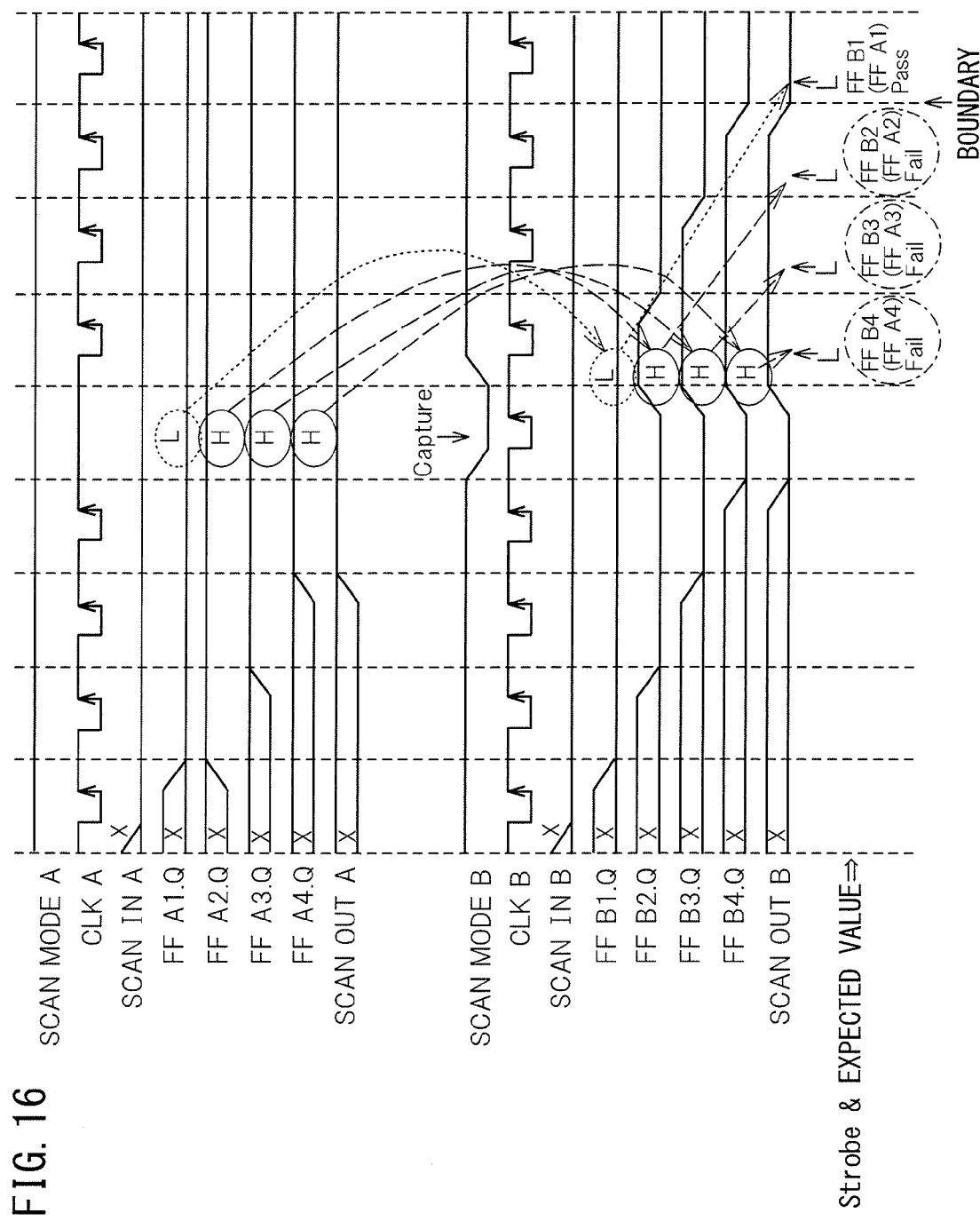
FIG. 16 is a time chart showing a change in data of each part in the case where the normal capture test in which all of the data is set to "0" at S14 is performed for the semiconductor device in FIG. 13.

FIG. 16 is a time chart showing a change in data of each part in the case where the normal capture test in which all the data is set to "0" at S14 is performed for the semiconductor device in FIG. 13.

As illustrated schematically, at S41, by supplying CLK A and CLK B (here, clocks corresponding to four clocks are supplied) in the state where "0 (L)" is supplied as SCAN IN A and SCAN IN B, "0" is set to FF A1 to FF A4 and FF B1 to FF B4 of the scan chains A and B. In contrast, the scan chain B is normal and FF B1 to FF B4 enter the state of holding and outputting "0". On the other hand, in the scan chain A, the stuck-at 1 fault has occurred in the wire between FF A1 and FF A2, and therefore, FF A2 receives "1 (H)" as the shift data and the output also becomes 1, and therefore, FF A3 and FF A4 are set to "1".

At step S42, FF B1 to FF B4 of the scan chain B capture the output data of FF A1 to FF A4 of the scan chain A. Because of this, FF B1 to FF B4 enter the state of holding and outputting "0111 (LHHH)".

At step S43, the scan chain B outputs the data held in FF B1 to FF B4 as SCAN OUT B and the output data becomes "0111 (LHHH)", and therefore, the first to third output data do not agree with the expected value and the fourth output data agrees with the expected data. Consequently, it is specified that the stuck-at 1 fault may have has occurred in the wire between FF A1 and FF A2 of the scan chain A is strong because the pass/fail boundary is FF B1 (FF A1) and FF B2 (FF A2).

Figure 17:
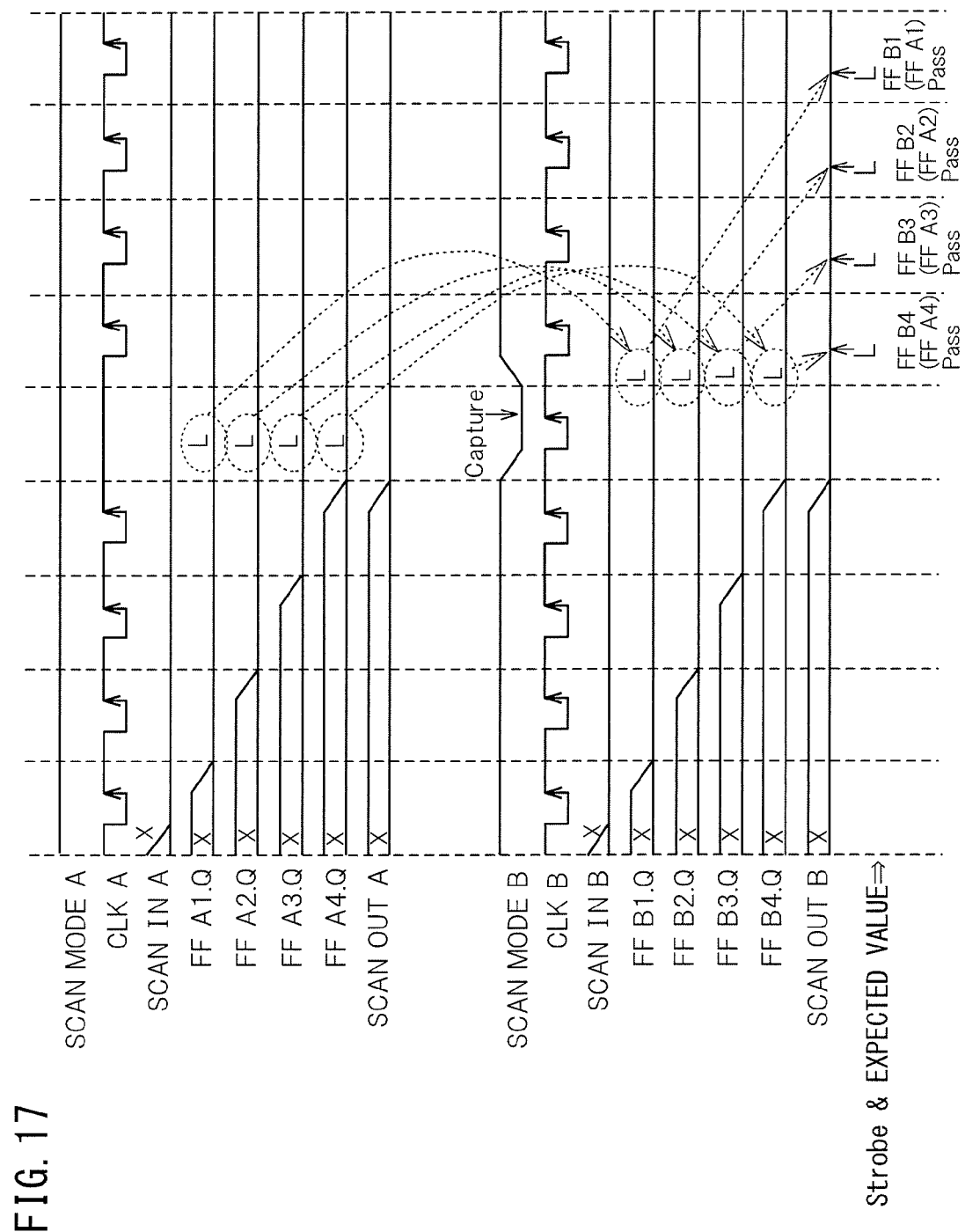
FIG. 17 is a time chart corresponding to that in FIG. 16 in the case where the wire between FF A1 and FF A2 is normal is.

For reference, a time chart corresponding to that in FIG. 16 in the case where the wire between FF A1 and FF A2 is normal is illustrated in FIG. 17. To all FF A1 to FF A4, "0 (L)" is set and the scan chain B captures all the data of "0 (L)" and outputs them as SCAN OUT B, and therefore, they agree with the expected value 0.

Figure 18:
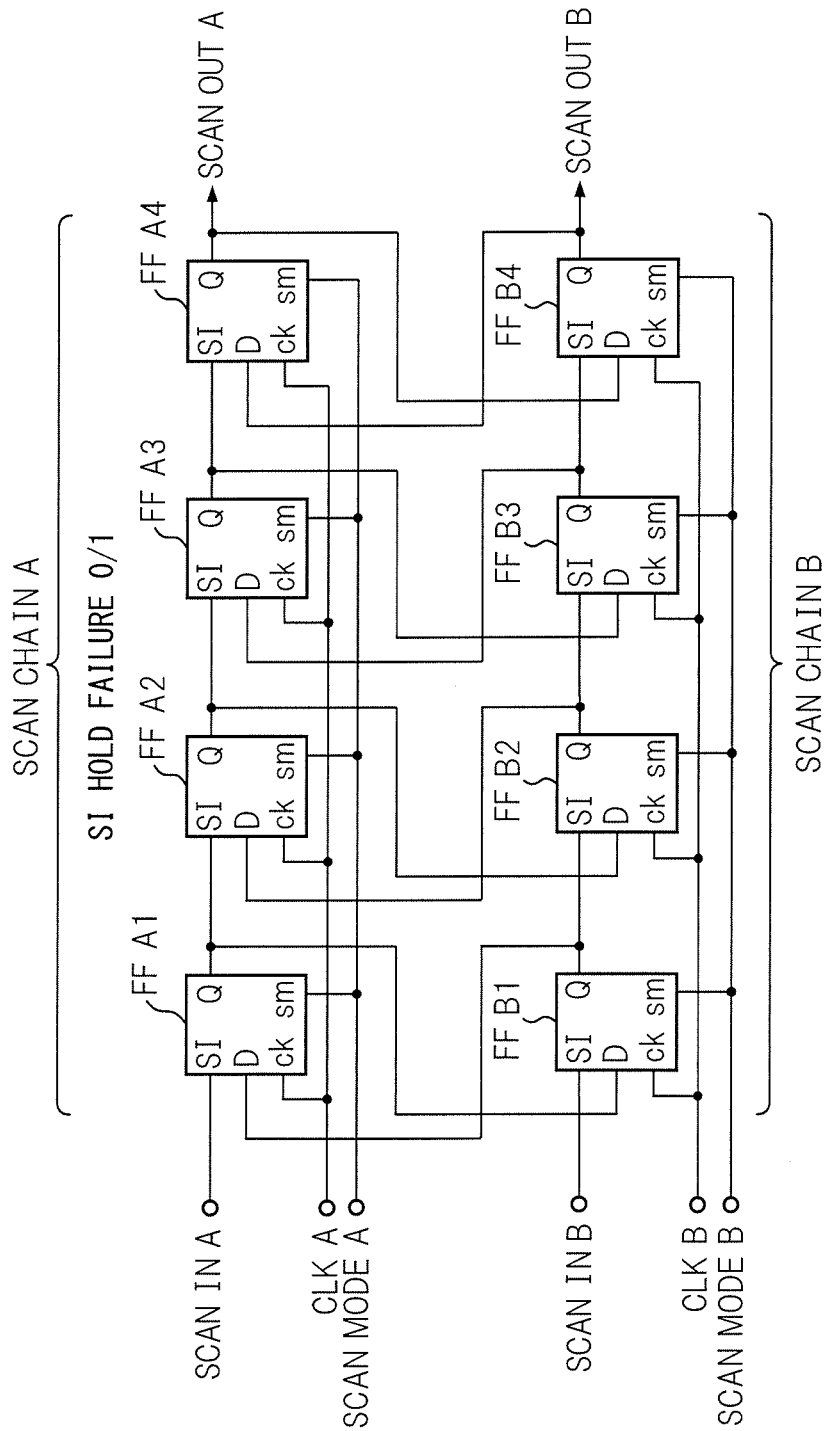
FIG. 18 illustrates the case where the hold time fault (the hold time runs short and different data is taken in) has occurred in FF A2 in the semiconductor device of the first embodiment.

FIG. 18 illustrates the case where the hold time fault (the hold time runs short and different data is taken in) has occurred in FF A2 in the semiconductor device of the First Embodiment.

Figure 19:
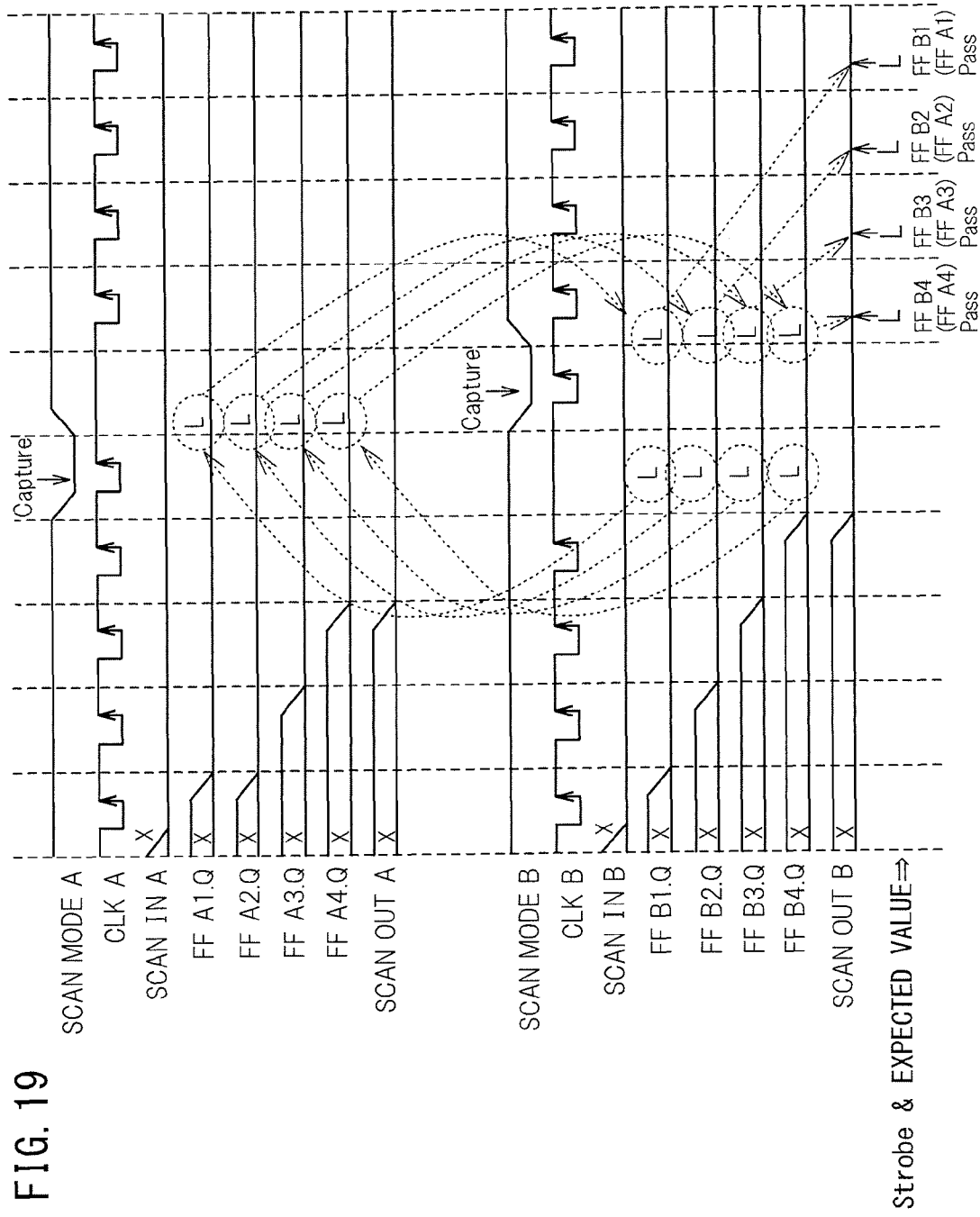
FIG. 19 is a time chart showing a change in data of each part in the case where the mutual capture test in which all of the data is set to "0" at S12 is performed for the semiconductor device in FIG. 18.

FIG. 19 is a time chart showing a change in data of each part in the case where the mutual capture test in which all the data is set to "0" at S12 is performed for the semiconductor device in FIG. 18.

As illustrated schematically, at S21, by supplying CLK A and CLK B (here, clocks corresponding to four clocks are supplied) in the state where "0 (L)" is supplied as SCAN IN A and SCAN IN B, "0" is set to FF A1 to FF A4 and FF B1 to FF B4 of the scan chains A and B. In contrast, the scan chain B is normal and FF B1 to FF B4 enter the state of holding and outputting "0". On the other hand, in the scan chain A, the hold time fault has occurred in FF A2, however, those which are shifted are continuous "0s", and therefore, FF A1 to FF A4 are set to "0".

At step S22, FF A1 to FF A4 of the scan chain A capture the output data of FF B1 to FF B4 of the scan chain B. Because of this, although the hold time fault has occurred in FF A2, the data that is held is "0" and the data that is captured is also "0", and therefore, all FF A1 to FF A4 enter the state of holding "0" and outputting "0".

At step S23, FF B1 to FF B4 of the scan chain B capture the output data of FF A1 to FF A4 of the scan chain A. Because of this, FF B1 to FF B4 enter the state of holding "0" and outputting "0".

At step S24, the scan chain B outputs the data held in FF B1 to FF B4 as SCAN OUT B and the output data becomes "0000 (LLLL)", and therefore, they all agree with the expected value. Consequently, it is not possible to specify that the hold time fault has occurred in FF A2.

Figure 20:
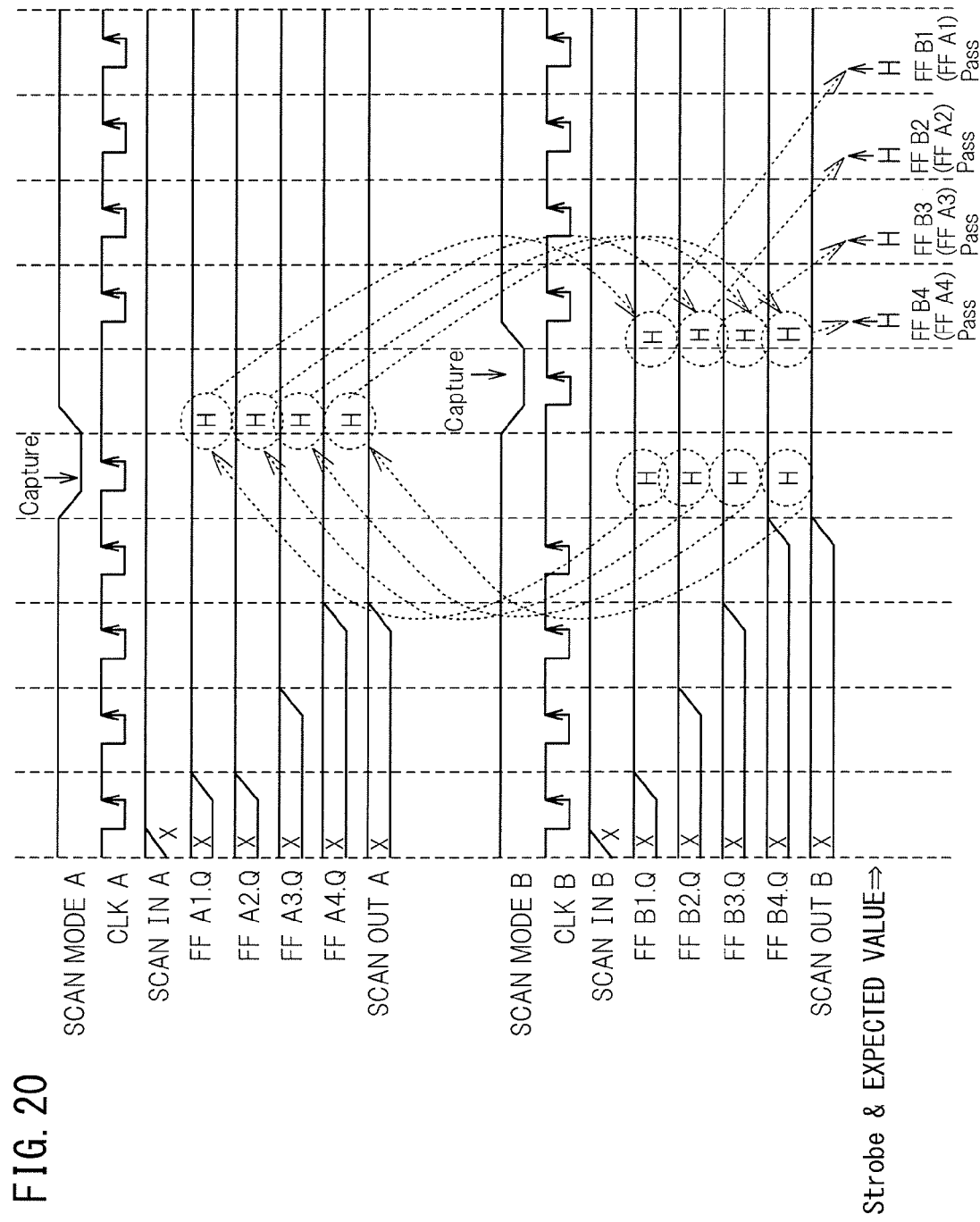
FIG. 20 is a time chart showing a change in data of each part in the case where the mutual capture test in which all of the data is set to "1" at S13 is performed for the semiconductor device in FIG. 18.

FIG. 20 is a time chart showing a change in data of each part in the case where the mutual capture test in which all the data is set to "1" at S13 is performed for the semiconductor device in FIG. 18.

As illustrated schematically, at S31, by supplying CLK A and CLK B (here, clocks corresponding to four clocks are supplied) in the state where "1 (H)" is supplied as SCAN IN A and SCAN IN B, "1" is set to FF A1 to FF A4 and FF B1 to FF B4 of the scan chains A and B. In contrast, the scan chain B is normal and FF B1 to FF B4 enter the state of holding and outputting "1". On the other hand, in the scan chain A, although the hold time fault has occurred in FF A2, those which are shifted are continuous "1s", and therefore, FF A1 to FF A4 are set to "1".

At step S32, FF A1 to FF A4 of the scan chain A capture the output data of FF B1 to FF B4 of the scan chain B. Because of this, although the hold time fault has occurred in FF A2, the data that FF A1 to FF A4 hold is "1" and the data that is captured is also "1", and therefore, all FF A1 to FF A4 enter the state of holding "1" and outputting "1".

At step S33, FF B1 to FF B4 of the scan chain B capture the output data of FF A1 to FF A4 of the scan chain A. Because of this, FF B1 to FF B4 enter the state of holding "1" and outputting "1".

At step S34, the scan chain B outputs the data held in FF B1 to FF B4 as SCAN OUT B and the output data becomes "1111 (HHHH)", and therefore, they all agree with the expected value. Consequently, it is not possible to specify that the hold time fault has occurred in FF A2.

Figure 21:
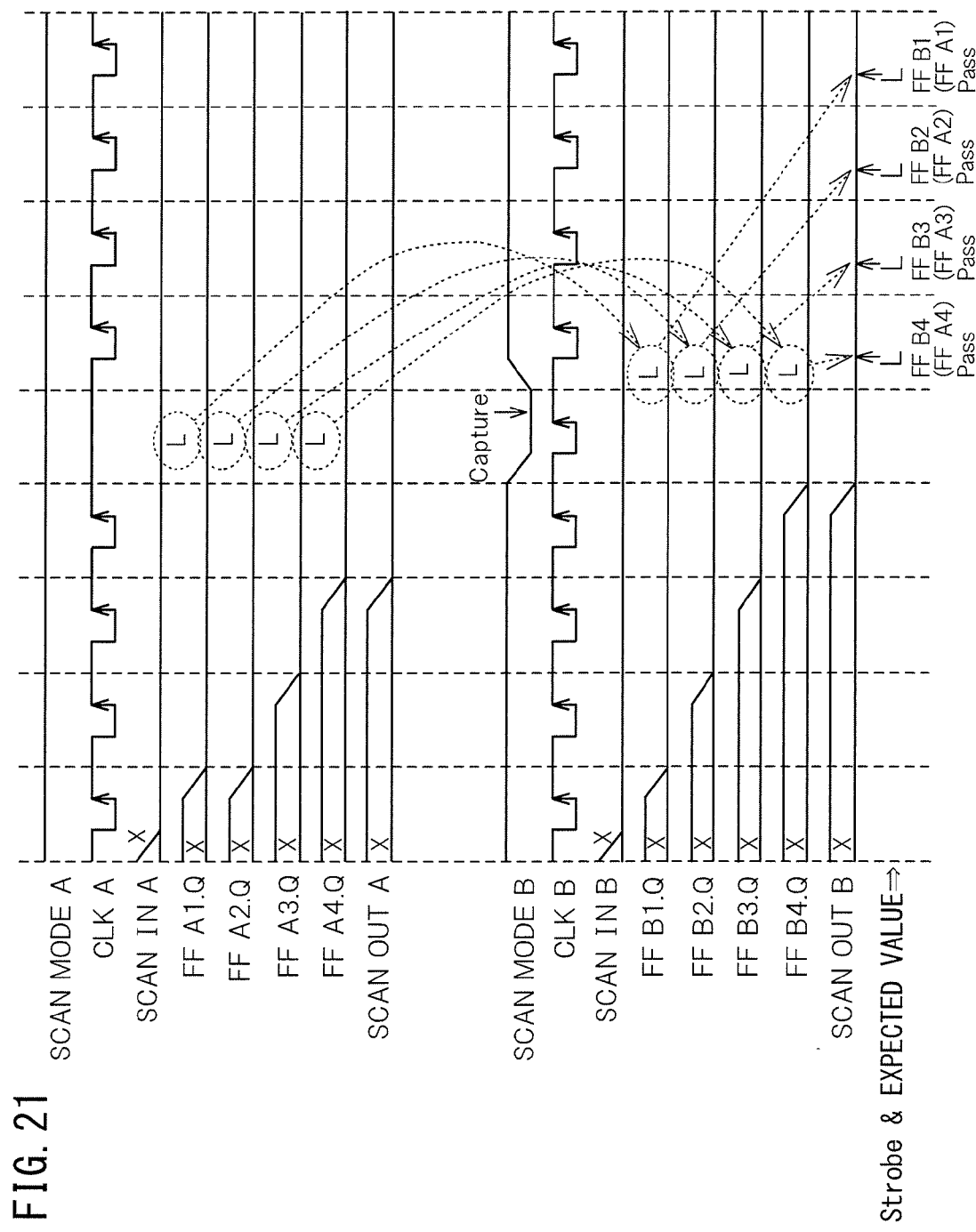
FIG. 21 is a time chart showing a change in data of each part in the case where the normal capture test in which all of the data is set to "0" at S14 is performed for the semiconductor device in FIG. 18.

FIG. 21 is a time chart showing a change in data of each part in the case where the normal capture test in which all the data is set to "0" at S14 is performed for the semiconductor device in FIG. 18.

As illustrated schematically, at S41, by supplying CLK A and CLK B (here, clocks corresponding to four clocks are supplied) in the state where "0 (L)" is supplied as SCAN IN A and SCAN IN B, "0" is set to FF A1 to FF A4 and FF B1 to FF B4 of the scan chains A and B. In contrast, the scan chain B is normal and FF B1 to FF B4 enter the state of holing and outputting "0". On the other hand, in the scan chain A, although the hold time fault has occurred in FF A2, those which are shifted are continuous "0s", and therefore, FF A1 to FF A4 are set to "0".

At step S42, FF B1 to FF B4 of the scan chain B capture the output data of FF A1 to FF A4 of the scan chain A. Because of this, FF B1 to FF B4 enter the state of holding and outputting "0000 (LLLL)".

At step S43, the scan chain B outputs the data held in FF B1 to FF B4 as SCAN OUT B and the output data becomes "0000 (LLLL)", and therefore, they all agree with the expected value. Consequently, it is not possible to specify that the hold time fault has occurred in FF A2.

Figure 22:
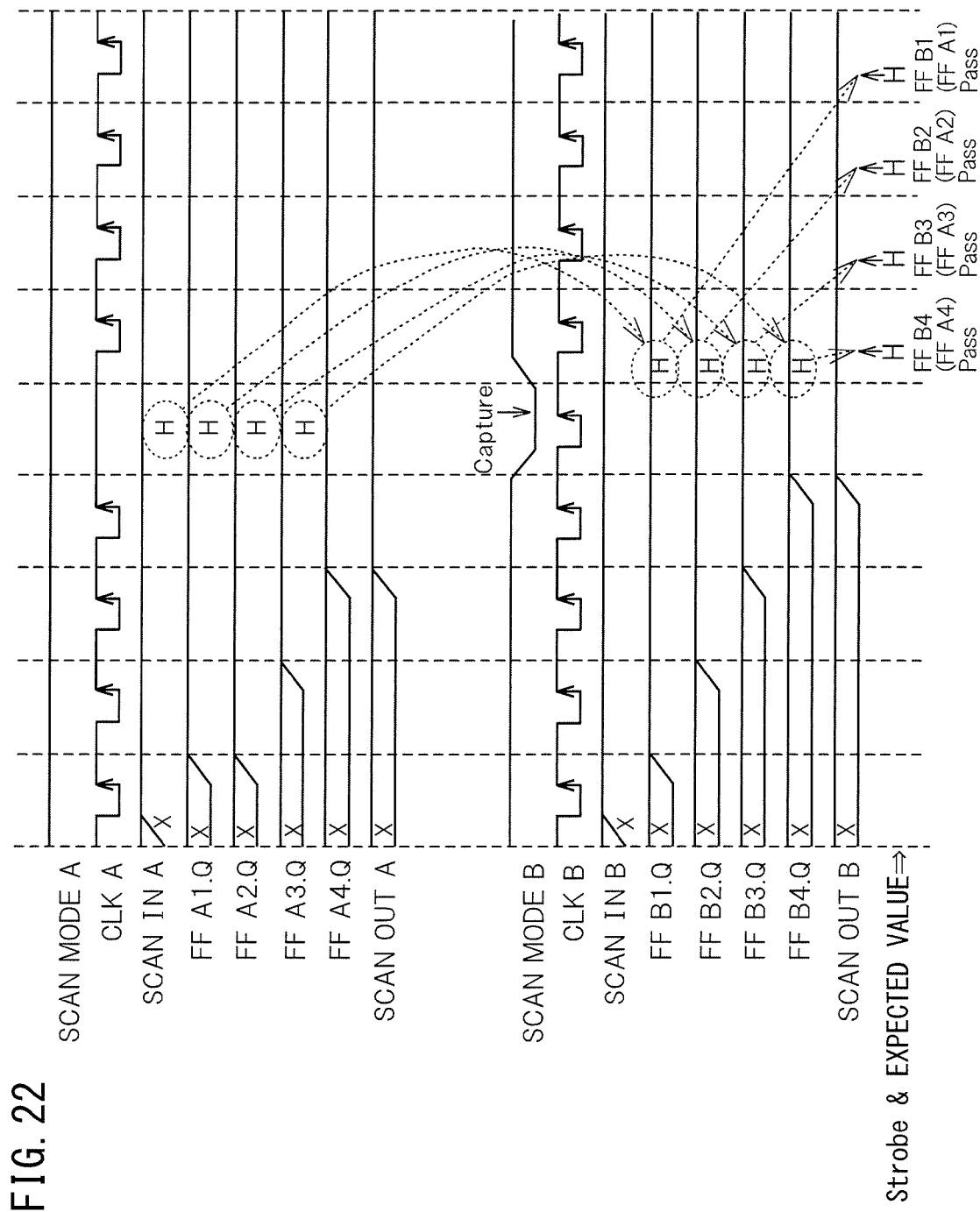
FIG. 22 is a time chart showing a change in data of each part in the case where the normal capture test in which all of the data is set to "1" at S15 is performed for the semiconductor device in FIG. 18.

FIG. 22 is a time chart showing a change in data of each part in the case where the normal capture test in which all the data is set to "1" at S15 is performed for the semiconductor device in FIG. 18.

As illustrated schematically, at S51, by supplying CLK A and CLK B (here, clocks corresponding to four clocks are supplied) in the state where "1 (H)" is supplied as SCAN IN A and SCAN IN B, "1" is set to FF A1 to FF A4 and FF B1 to FF B4 of the scan chains A and B. In contrast, the scan chain B is normal and FF B1 to FF B4 enter the state of holding and outputting "1". On the other hand, in the scan chain A, although the hold time fault has occurred in FF A2, those which are shifted are continuous "1s", and therefore, FF A1 to FF A4 are set to "1".

At step S52, FF B1 to FF B4 of the scan chain B capture the output data of FF A1 to FF A4 of the scan chain A. Because of this, FF B1 to FF B4 enter the state of holding and outputting "1111 (HHHH)".

At step S53, the scan chain B outputs the data held in FF B1 to FF B4 as SCAN OUT B and the output data becomes "1111 (HHHH)", and therefore, they all agree with the expected value. Consequently, it is not possible to specify that the hold time fault has occurred in FF A2.

Figure 23:
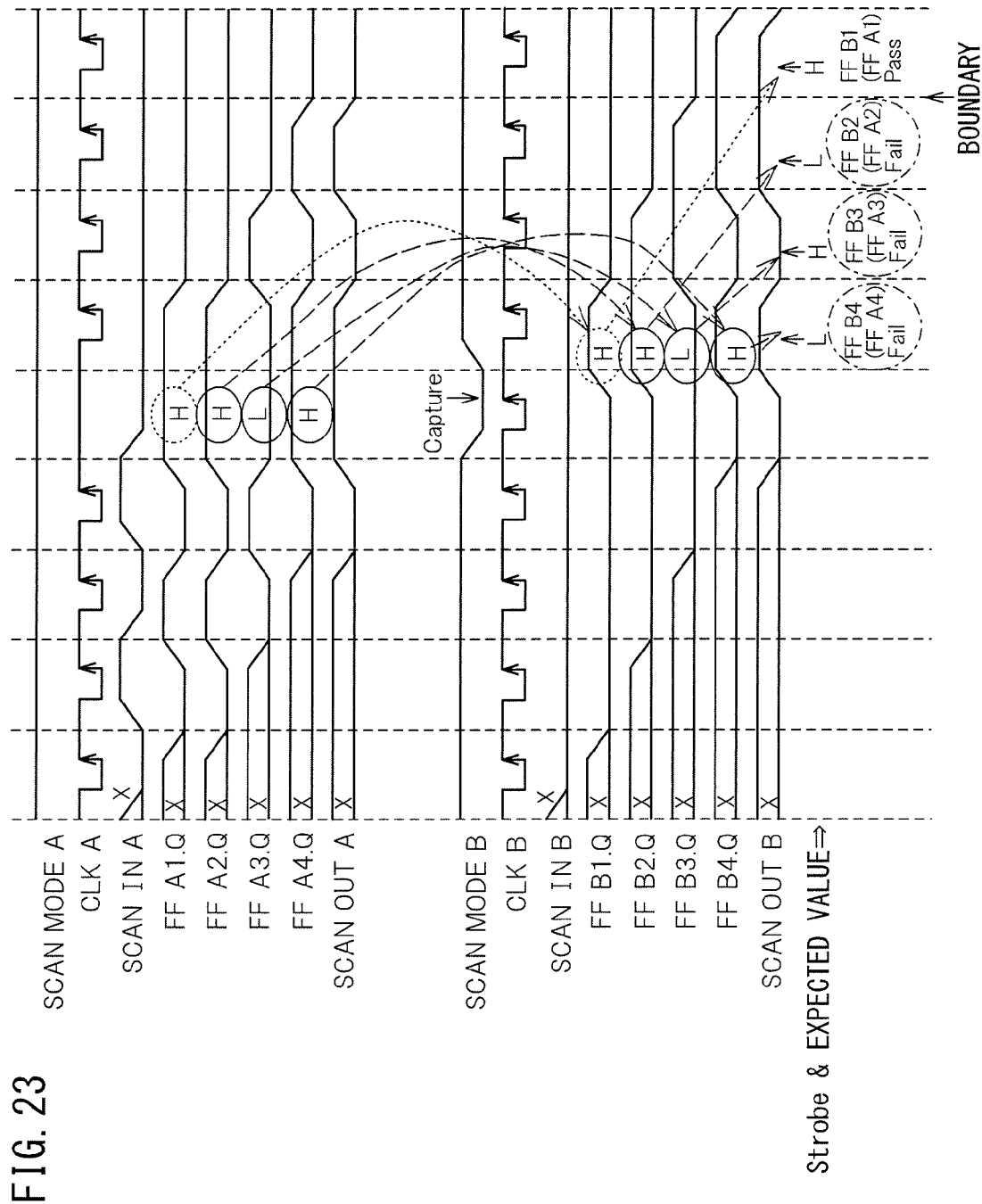
FIG. 23 is a time chart showing a change in data of each part in the case where the normal capture test in which SCAN IN A is set to "0101 (LHLH)" at S16 is performed for the semiconductor device in FIG. 18.

FIG. 23 is a time chart showing a change in data of each part in the case where the normal capture test in which SCAN IN A is set to "0101 (LHLH)" at S16 is performed for the semiconductor device in FIG. 18. In this case, "0000" is supplied as SCAN IN B.

As illustrated schematically, at S61, by supplying "0101" as SCAN IN A in synchronization with CLK A, "0101" is set to FF A1 to FF A4 of the scan chain A. Further, by supplying "0000" as SCAN IN B in synchronization with CLK B, "0000" is set to FF B1 to FF B4 of the scan chain B. The scan chain B is normal and FF B1 to FF B4 enter the state of holding and outputting "0000". On the other hand, in the scan chain A, the hold time fault has occurred in FF A2, and therefore, FF A2 captures the same data as that FF A1 captures and in FF A3 and FF A4, the value is set with one clock period shifted. Consequently, FF A1 to FF A4 are set to "1101 (HHLH)".

At step S62, FF B1 to FF B4 of the scan chain B capture the output data of FF A1 to FF A4 of the scan chain A. Because of this, FF B1 to FF B4 enter the state of holding and outputting "1101 (HHLH)".

At step S63, the scan chain B outputs the data held in FF B1 to FF B4 as SCAN OUT B and the output data becomes "1101 (HHLH)", and therefore, the first to third output data do not agree with the expected value and only the fourth output data agrees with the expected value. Consequently, it is specified that the pass/fail boundary exists between FF A1 and FF A2 and the possibility that the hold time fault has occurred in FF A2 is strong.

Figure 24:
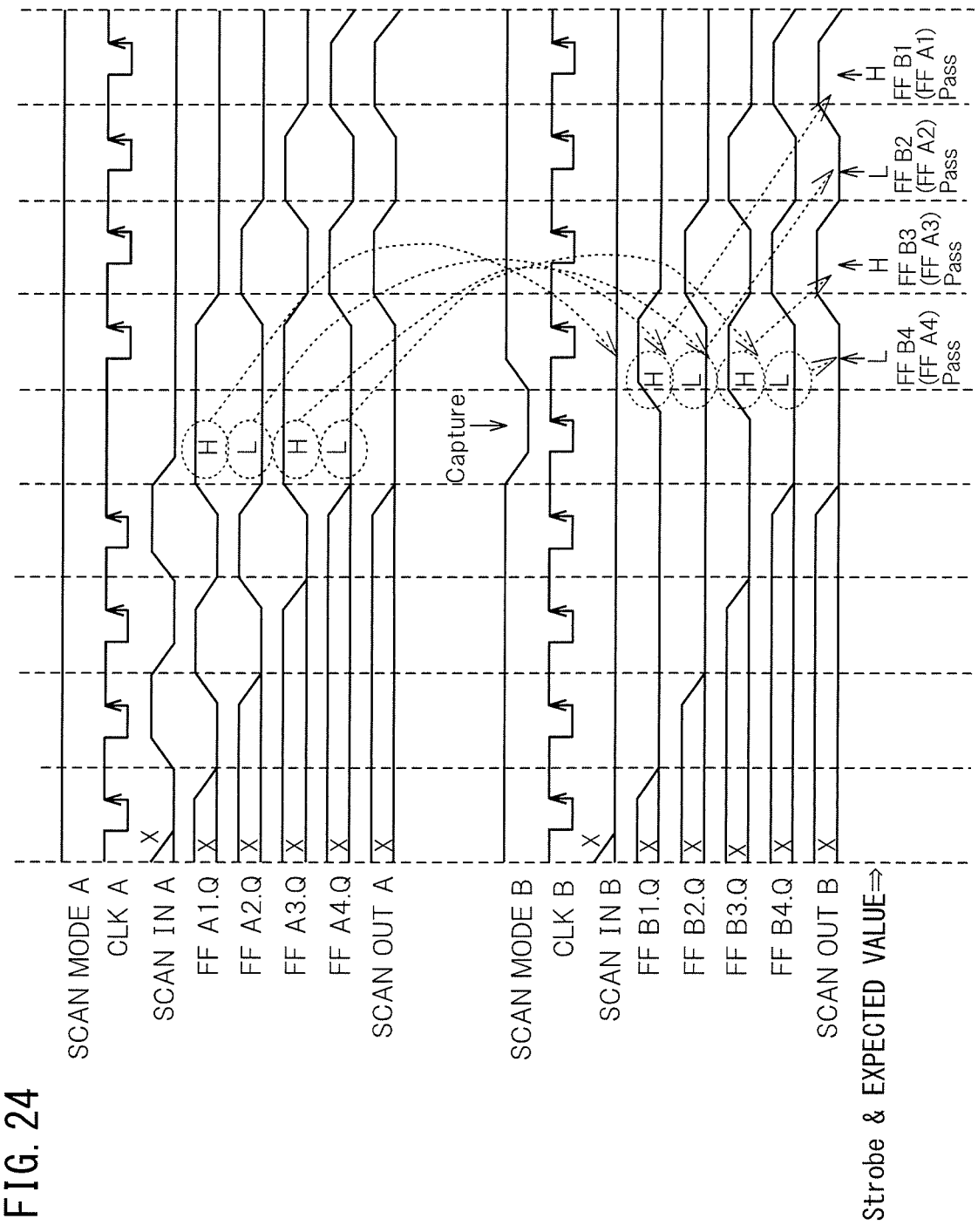
FIG. 24 is a time chart corresponding to that in FIG. 23 in the normal case where the hold time fault has not occurred in FF A2 is illustrated in FIG. 24.

For reference, a time chart corresponding to that in FIG. 23 in the normal case where the hold time fault has not occurred in FF A2 is illustrated in FIG. 24. To all FF A1 to FF A4, "0101 (LHLH)" is set and the scan chain B captures the data of "0101 (LHLH)" and outputs it as SCAN OUT B, and therefore, they agree with the expected value.

Figure 25:
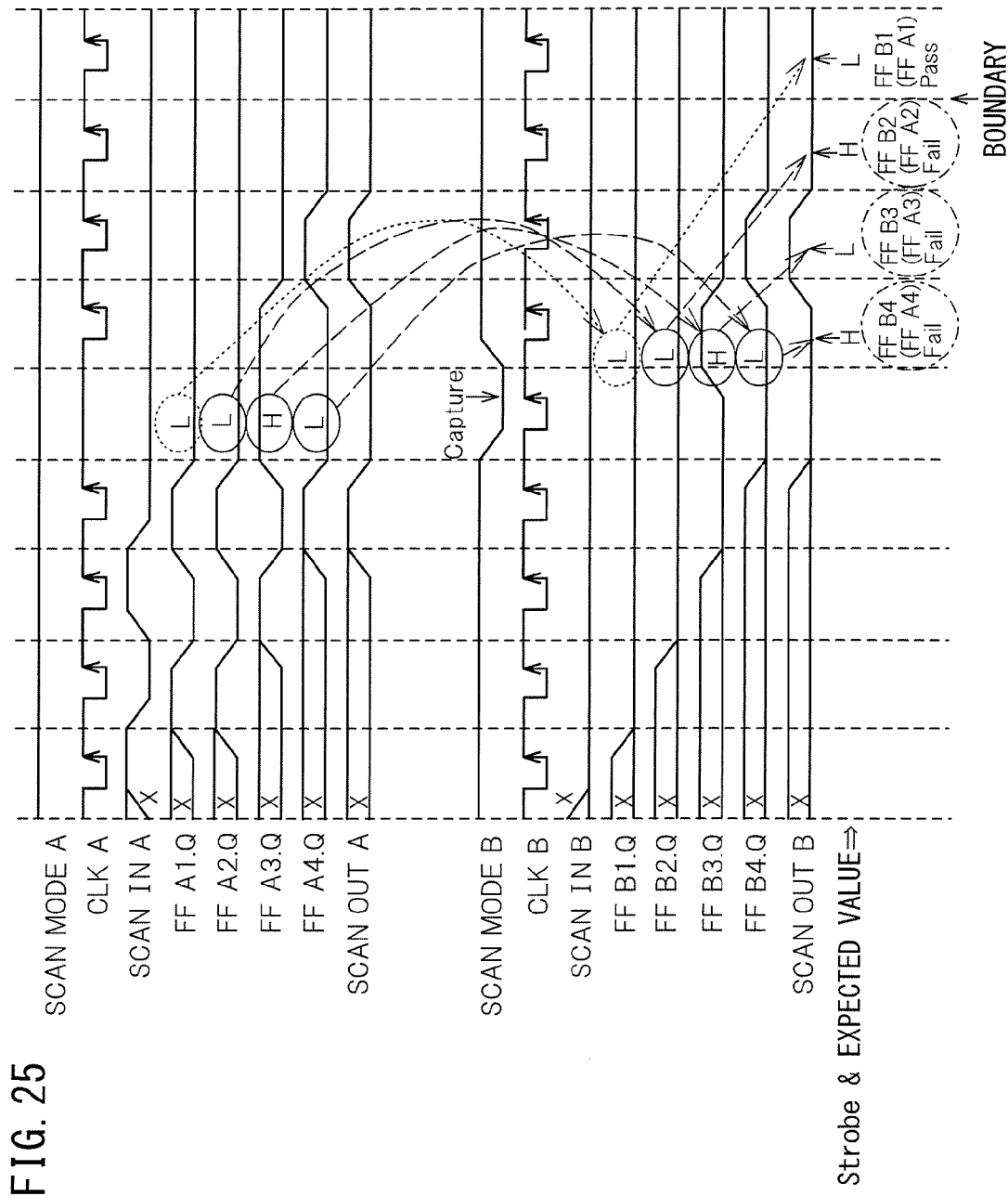
FIG. 25 is a time chart showing a change in data of each part in the case where the normal capture test in which SCAN IN A is set to "1010 (HLHL)" at S17 is performed for the semiconductor device in FIG. 18.

FIG. 25 is a time chart showing a change in data of each part in the case where the normal capture test in which SCAN IN A is set to "1010 (HLHL)" at S17 is performed for the semiconductor device in FIG. 18. In this case, "0000" is supplied as SCAN IN B.

As illustrated schematically, at S71, by supplying "1010" as SCAN IN A in synchronization with CLK A, "1010" is set to FF A1 to FF A4 of the scan chain A. Further, by supplying "0000" as SCAN IN B in synchronization with CLK B, "0000" is set to FF B1 to FF B4 of the scan chain B. The scan chain B is normal and FF B1 to FF B4 enter the state of holding and outputting "0000". On the other hand, in the scan chain A, the hold time fault has occurred in FF A2, and therefore, FF A2 captures the same data as that FF A1 captures and in FF A3 and FF A4, the value is set with one clock period shifted. Consequently, FF A1 to FF A4 are set to "0010 (LLHL)".

At step S72, FF B1 to FF B4 of the scan chain B capture the output data of FF A1 to FF A4 of the scan chain A. Because of this, FF B1 to FF B4 enter the state of holding and outputting "0010 (LLHL)".

At step S73, the scan chain B outputs the data held in FF B1 to FF B4 as SCAN OUT B and the output data becomes "0010 (LLHL)", and therefore, the first to third output data do not agree with the expected value and only the fourth output data agrees with the expected value. Consequently, it is specified that the pass/fail boundary exists between FF A1 and FF A2 and the possibility that the hold time fault has occurred in FF A2 is strong.

Figure 26:
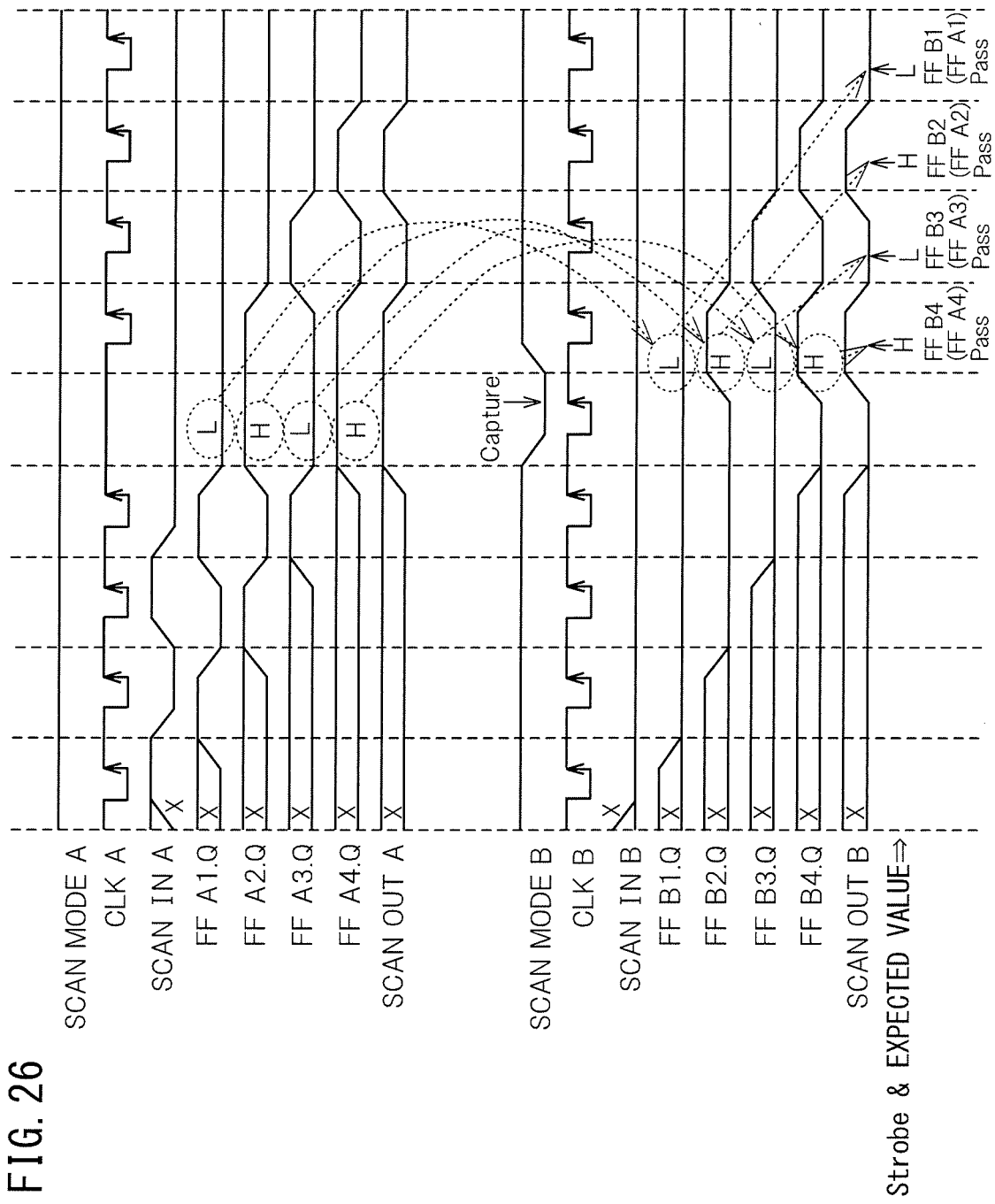
FIG. 26 is a time chart corresponding to that in FIG. 25 in the normal case where the hold time fault has not occurred in FF A2.

For reference, a time chart corresponding to that in FIG. 25 in the normal case where the hold time fault has not occurred in FF A2 is illustrated in FIG. 26. To all FF A1 to FF A4, "1010 (HLHL)" is set and the scan chain B captures the data of "1010 (HLHL)" and outputs it as SCAN OUT B, and therefore, they agree with the expected value.

If the addresses at which the failure has occurred in FIG. 23 and FIG. 25 described above are merged, FF B1 (FF A1) and FF B2 (FF A2) become the pass/fail boundary, and therefore, it is known that the possibility of the hold time error between the shift data input SI of FF A2 and the clock CK is strong.

In the semiconductor device of the first embodiment, the case where the semiconductor device has the two scan chains A and B is explained, however, the number is not limited to this and any number of scan chains may be accepted as long as the number is a multiple of 2. Because of this, in the case where the scan chains are formed in the semiconductor device, it is desirable to implement the configuration of the first embodiment by setting the number of scan chains to a multiple of 2 and making two scan chains into a pair.

Further, in the semiconductor device of the first embodiment, the case where the number of FFs forming the scan chain A, that is, the number of stages, is equal to the number of stages of the scan chain B is explained. In the case where the scan chains are formed in the semiconductor device, it is desirable to make equal the numbers of stages of the two scan chains to be made into a pair. However, a case where it is not possible to make the numbers of stages of the two scan chains equal may occurs. In an embodiment explained below, the present invention is applied to the case where the numbers of stages of the two scan chains are not equal.

Figure 27:
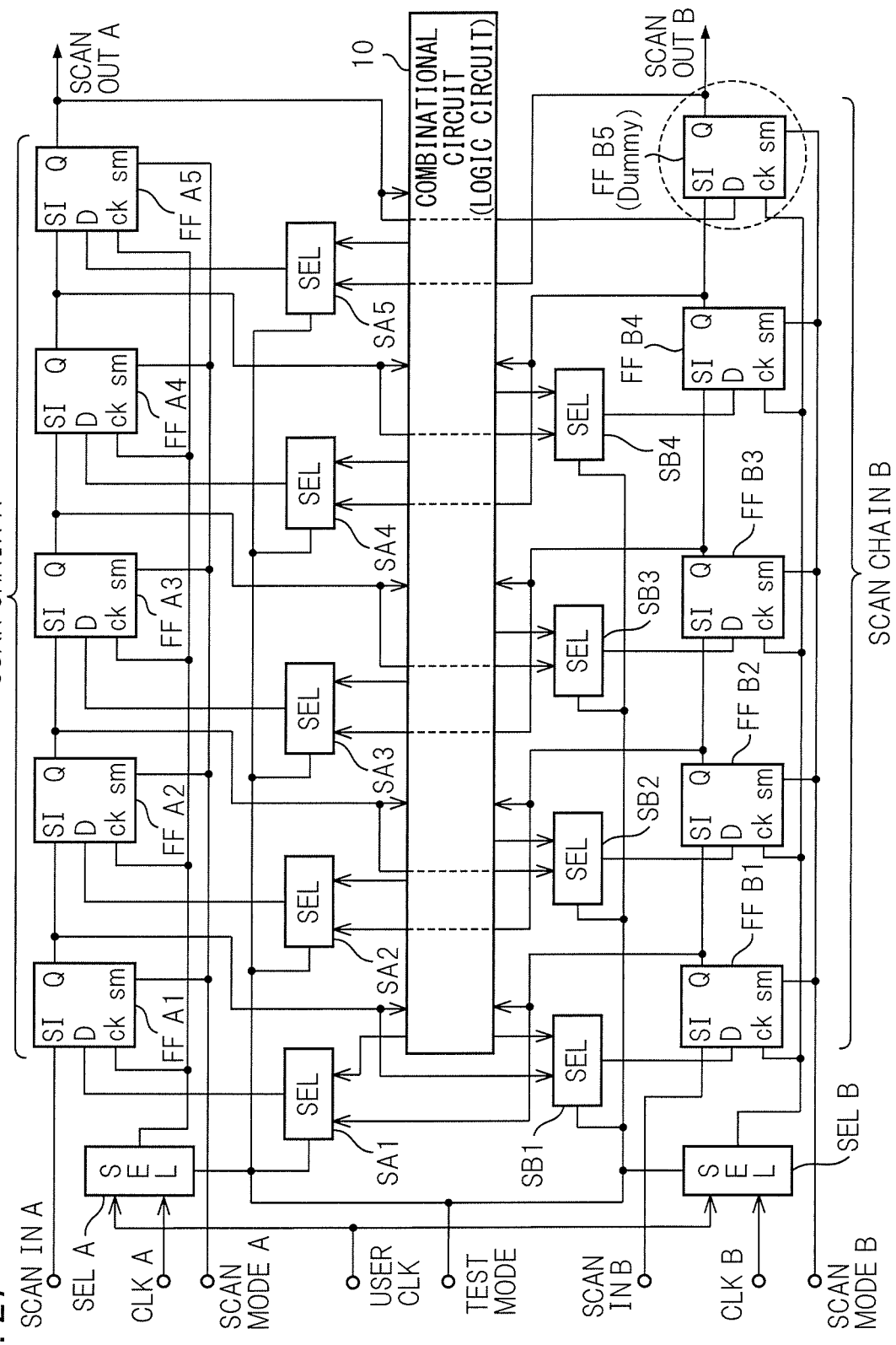
FIG. 27 is a diagram illustrating a configuration of a semiconductor device of a second embodiment.

FIG. 27 is a diagram illustrating a configuration of a semiconductor device of a second embodiment.

The semiconductor device of the second embodiment differs from that of the first embodiment in that the scan chain A is formed by five FFs and the scan chain B is formed by four FFs. In other words, in the semiconductor device of the second embodiment, the number of stages of the scan chain B is four while the number of stages of the scan chain A is five.

The semiconductor device of the second embodiment has a dummy flip-flop FF B5 provided in order to make equal the numbers of stages of the scan chain A and the scan chain B. There is provided a selection circuit SA5 configured to select data to be input to a data input D of a fifth FF A5 of the scan chain A between the data of the combinational circuit 10 and the output data of FF B5. However, since FF B5 does not capture the data of the combinational data 10, the output data of FF A5 is input directly to the data input D.

As the semiconductor device of the first embodiment, it is possible for the semiconductor device of the second embodiment to estimate various faults and fault locations of the scan circuit (scan chains A and B). The test operation of the scan circuit is the same as that of the first embodiment, and therefore, explanation is omitted.

FIG. 28 is a diagram illustrating a configuration of a semiconductor device of a third embodiment.

The semiconductor device of the third embodiment differs from that of the first embodiment in that the scan chain A is formed by five FFs and the scan chain B is formed by four FFs. In other words, in the semiconductor device of the third embodiment, the number of stages of the scan chain B is four while the number of stages of the scan chain A is five.

In the semiconductor device of the third embodiment, it is made possible to output the data output Q of FF A4 in the fourth stage of the scan chain A to the outside as SCAN OUT A'. To the data input D of the fifth FF A5 of the scan chain A, the data of the combinational circuit 10 is input directly.

In the semiconductor device of the third embodiment, the test of FFs in the first to fourth stages of the scan chain A and the scan chain B is performed in the same manner as that of the first embodiment. However, it is not possible to perform the test of FF A5 in the fifth stage of the scan chain A. Whether a fault has occurred in the scan chain A including FF A5 can be determined by the normal chain test at S11 in FIG. 6. In the case where it is determined that there is a fault in the scan chain A, the test of FFs in the first to fourth stages of the scan chain A is performed and if there is no fault, it is possible to estimate that a fault has occurred in FF A5. As described above, in the semiconductor device of the third embodiment, it is not possible to estimate the type of fault relating to FF A5, however, it is possible to estimate pass/fail of FF A5, and therefore, there is no problem for practical use. The semiconductor device of the third embodiment does not provide the dummy FFs as in the second embodiment, and therefore, it is possible to reduce the circuit scale accordingly.

In the semiconductor devices of the first to third embodiments explained as above, it is made possible to easily estimate the stuck position of the scan data due to the stuck-at 0/1 fault of the scan chain and the fault of hold time failure, and this can be used for an early investigation to determine the cause of a failure.

In particular, the analysis of undetectable problems relating to the scan chain failure at the time of development of the product of the state-of-the-art technology in which miniaturization is in progress is facilitated by applying the circuit of the embodiments and it is made possible to specify the cause of a fault with higher precision.

Further, by feeding back the causes of the process failure and design failure determined by the configuration of the embodiments to the process and design of the actual products, it is possible to avoid problems in the products in advance.

The technology disclosed in the embodiments can also be applied to the products, however, by applying it to TEG, it is possible to improve the precision and speed of the analysis of trouble in the trial stage.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A scan circuit comprising:
a first scan chain in which a plurality of first flip-flops are connected in series; and
a second scan chain in which a plurality of second flip-flops are connected in series, wherein
the first scan chain is configured to capture first output data of at least one of the first flip-flops of the second scan chain, and
the second scan chain is configured to capture second output data of at least one of the second flip-flops of the first scan chain.

2. The scan circuit according to claim 1, wherein
the plurality of first flip-flops are configured to output the first output data in synchronization with a first clock, and
the plurality of second flip-flops are configured to output the second output data in synchronization with a second clock.

3. The scan circuit according to claim 2, wherein
the number of the plurality of first flip-flops is equal to the number of the plurality of second flip-flops.

4. The scan circuit according to claim 2, wherein
the number of the plurality of first flip-flops is larger than the number of the plurality of second flip-flops by n (n is a natural number), and
the second scan chain includes n dummy flip-flops.

5. The scan circuit according to claim 2, wherein
the first scan chain includes an auxiliary output terminal connected to the n dummy flip-flops.

6. A semiconductor device comprising:
a combinational circuit; and
a scan circuit, wherein
the scan circuit includes:
a first scan chain in which a plurality of first flip-flops are connected in series; and
a second scan chain in which a plurality of second flip-flops are connected in series,
the first scan chain is configured to capture first output data of at least one of the first flip-flops of the second scan chain, and
the second scan chain is configured to capture second output data of at least one of the second flip-flops of the first scan chain.

7. The semiconductor device according to claim 6, wherein
the plurality of first flip-flops output the first output data in synchronization with a first clock, and
the plurality of second flip-flops output the second output data in synchronization with a second clock.

8. The semiconductor device according to claim 7, wherein
the number of the plurality of first flip-flops is equal to the number of the plurality of second flip-flops.

9. The semiconductor device according to claim 7, wherein
the number of the plurality of first flip-flops is larger than the number of the plurality of second flip-flops by n (n is a natural number), and
the second scan chain includes n dummy flip-flops.

10. The semiconductor device according to claim 7, wherein
the first scan chain includes an auxiliary output terminal connected to the n dummy flip-flops.

11. A method for testing a semiconductor device including a combinational circuit and a scan circuit, the scan circuit including a first scan chain in which a plurality of first flip-flops are connected in series, and a second scan chain in which a plurality of second flip-flops are connected in series, the first scan chain being configured to capture first output data of at least one of the first flip-flops of the second scan chain, the second scan chain being configured to capture second output data of at least one of the second flip-flops of the first scan chain, the method comprising:
estimating whether there is a fault in the first and second scan chains by successively inputting scan data of "0" or "1" to the first and second scan chains, respectively, and by comparing scan data output from the first and second scan chains, respectively, with an expected value; and
estimating, by using one of the scan chains in which it is estimated that there is no fault, a type of the fault and an occurrence position of the fault with respect to the other scan chain in which it is estimated that there is a fault.

12. The method for testing a semiconductor device according to claim 11 comprising
performing a mutual capture test, wherein in the mutual capture test:
scan data of "0" or "1" is set successively to the one scan chain in which it is estimated that there is no fault;
the other scan chain in which it is estimated that there is a fault captures data of the one scan chain;
the one scan chain captures data of the other scan chain; and
data output from the one scan chain is compared with an expected value.

13. The method for testing a semiconductor device according to claim 12, comprising
performing a normal capture test,
wherein in the normal capture test:
scan data of "0" or "1" is set successively to the other scan chain in which it is estimated that there is a fault;
the one scan chain captures data of the other scan chain; and
data output from the one scan chain is compared with an expected value.

14. The method for testing a semiconductor device according to claim 12, comprising
performing a normal capture test,
wherein in the normal capture test:
scan data that alternately changes to "0" then "1" or to "1" then "0" is set successively to the other scan chain in which it is estimated that there is a fault;
the one scan chain captures data of the other scan chain; and
data output from the one scan chain is compared with an expected value.

* * * * *